United States Patent
Kim et al.

(10) Patent No.: US 10,930,790 B2
(45) Date of Patent: Feb. 23, 2021

(54) THIN FILM TRANSISTOR, GATE DRIVER INCLUDING THE SAME, AND DISPLAY DEVICE INCLUDING THE GATE DRIVER

(71) Applicant: LG Display Co., Ltd., Seoul (KR)

(72) Inventors: SeungJin Kim, Paju-si (KR); HeeSung Lee, Incheon (KR); Sohyung Lee, Goyang-si (KR); MinCheol Kim, Paju-si (KR); JeongSuk Yang, Goyang-si (KR); JeeHo Park, Seoul (KR); Seoyeon Im, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/994,765

(22) Filed: May 31, 2018

(65) Prior Publication Data

US 2018/0350995 A1 Dec. 6, 2018

(30) Foreign Application Priority Data

May 31, 2017 (KR) .................. 10-2017-0068037
Dec. 11, 2017 (KR) .................. 10-2017-0169420

(51) Int. Cl.
*H01L 29/786* (2006.01)
*H01L 27/12* (2006.01)
(Continued)

(52) U.S. Cl.
CPC ....... *H01L 29/7869* (2013.01); *G09G 3/3266* (2013.01); *H01L 27/1225* (2013.01);
(Continued)

(58) Field of Classification Search
None
See application file for complete search history.

(56) References Cited

U.S. PATENT DOCUMENTS

2013/0009219 A1  1/2013  Yamazaki et al.
2013/0099229 A1  4/2013  Wakana et al.
(Continued)

FOREIGN PATENT DOCUMENTS

CN   101263605 A   9/2008
CN   102812150 A   12/2012
(Continued)

OTHER PUBLICATIONS

Machine-generated English translation of JP 2019-160829, total pp. 39. (Year: 2019).*

*Primary Examiner* — Bo B Jang
(74) *Attorney, Agent, or Firm* — Seed IP Law Group LLP

(57) ABSTRACT

Disclosed are a thin film transistor (TFT) including an oxide semiconductor layer capable of being applied to high-resolution flat panel display devices requiring high-speed driving, a gate driver including the TFT, and a display device including the gate driver. The TFT includes first oxide semiconductor layer consisting of indium-gallium-zinc-tin oxide (IGZTO) and a second oxide semiconductor layer including indium-gallium-zinc oxide (IGZO). A content ratio (Ga/In) of gallium (Ga) to indium (In) of the second oxide semiconductor layer is higher than a content (Ga/In) of Ga to In of the first oxide semiconductor layer, and a content ratio (Zn/In) of zinc (Zn) to In of the second oxide semiconductor layer is higher than a content (Zn/In) of Zn to In of the first oxide semiconductor layer.

21 Claims, 16 Drawing Sheets

(51) Int. Cl.
*H01L 29/24* (2006.01)
*G09G 3/3266* (2016.01)
*H01L 29/66* (2006.01)
*H01L 29/417* (2006.01)
*G09G 3/3291* (2016.01)

(52) U.S. Cl.
CPC ........ *H01L 29/24* (2013.01); *H01L 29/41733* (2013.01); *H01L 29/66969* (2013.01); *H01L 29/78696* (2013.01); *G09G 3/3291* (2013.01); *G09G 2300/0426* (2013.01); *G09G 2300/0819* (2013.01); *G09G 2300/0842* (2013.01); *G09G 2310/0245* (2013.01); *G09G 2310/08* (2013.01)

(56) References Cited

U.S. PATENT DOCUMENTS

| | | |
|---|---|---|
| 2013/0161608 A1 | 6/2013 | Yamazaki |
| 2014/0138674 A1 | 5/2014 | Sato et al. |
| 2015/0034950 A1 | 2/2015 | Miyazawa et al. |
| 2015/0060990 A1 | 3/2015 | Kim et al. |
| 2015/0076488 A1 | 3/2015 | Kishi et al. |
| 2015/0076489 A1 | 3/2015 | Morita et al. |
| 2015/0091000 A1 | 4/2015 | Morita et al. |
| 2015/0091002 A1 | 4/2015 | Hayashi et al. |
| 2015/0123116 A1 | 5/2015 | Goto et al. |
| 2015/0295058 A1 | 10/2015 | Morita et al. |
| 2016/0315201 A1 | 10/2016 | Lee et al. |

FOREIGN PATENT DOCUMENTS

| | | |
|---|---|---|
| CN | 102867854 A | 1/2013 |
| CN | 103824886 A | 5/2014 |
| CN | 103999228 A | 8/2014 |
| CN | 104335354 A | 2/2015 |
| CN | 104425611 A | 3/2015 |
| JP | 2007-281409 A | 10/2007 |
| JP | 2010-28021 A | 2/2010 |
| JP | 2010-40552 A | 2/2010 |
| JP | 2011-108873 A | 6/2011 |
| JP | 2013-38399 A | 2/2013 |
| JP | 2013-149965 A | 8/2013 |
| JP | 2014-116588 A | 6/2014 |
| JP | 2014-214359 A | 11/2014 |
| JP | 2014-232870 A | 12/2014 |
| JP | 2015-33026 A | 2/2015 |
| JP | 2019-160829 A * | 9/2019 |
| KR | 10-2018-0058406 A | 6/2008 |
| KR | 10-2013-0006344 A | 1/2013 |
| KR | 10-2014-0063444 A | 5/2014 |
| KR | 10-2014-0107451 A | 9/2014 |
| KR | 10-2014-0131264 A | 11/2014 |
| KR | 10-1621644 B1 | 5/2016 |
| KR | 10-1648661 B1 | 8/2016 |
| KR | 10-1648684 B1 | 8/2016 |
| KR | 10-2017-0071780 A | 6/2017 |
| TW | 201407791 A | 2/2014 |
| WO | 2007/032294 A1 | 3/2007 |
| WO | 2011/132769 A1 | 10/2011 |
| WO | 2015/064468 A1 | 5/2015 |
| WO | 2016/175034 A1 | 11/2016 |

\* cited by examiner

FIG. 13

| Temperature of first substrate | Room temperature | 100°C | 150°C | 200°C | 250°C |
|---|---|---|---|---|---|
| Presence or non-presence of reverse taper | Presence | Presence | Presence | Non-presence | Non-presence | a : First oxide semiconductor layer    b : Second oxide semiconductor layer

THIN FILM TRANSISTOR, GATE DRIVER INCLUDING THE SAME, AND DISPLAY DEVICE INCLUDING THE GATE DRIVER

CROSS-REFERENCE TO RELATED APPLICATIONS

This application claims the benefit of the Korean Patent Application No. 10-2017-0068037, filed May 31, 2017, and 10-2017-0169420, filed Dec. 11, 2017, which is hereby incorporated by reference as if fully set forth herein.

BACKGROUND

Technical Field

The present disclosure relates to a thin film transistor (TFT), a gate driver including the same, and a display device including the gate driver.

Description of the Related Art

With the advancement of information-oriented society, various requirements for display devices for displaying an image are increasing. Consequently, various display devices such as liquid crystal display (LCD) devices, plasma display panel (PDP) devices, and emitting display devices are being used recently. Examples of light emitting display devices include organic light emitting display devices, which use an organic light emitting diode (OLED) as a light emitting element, and light emitting diode display devices which use a micro light emitting diode as a light emitting element.

Flat panel display devices each include a display panel, a gate driver, a data driver, and a timing controller. The display panel includes a plurality of data lines, a plurality of gate lines, and a plurality of pixels respectively provided in a plurality of areas defined by intersections of the data lines and the gate lines. When a gate signal is supplied to a gate line by using a TFT as a switching element, each of the pixels is supplied with a data voltage through a data line. Each of the pixels emits light having certain brightness with the data voltage.

Recently, flat panel display devices for displaying an image at a high resolution corresponding to an ultra-high definition (UHD) are being released, and flat panel display devices for displaying an image at a high resolution corresponding to an 8K UHD are being developed. The UHD denotes a resolution of 3840×2160, and the 8K UHD denotes a resolution of 7680×4320.

Flat panel display devices having a high resolution such as the UHD or the 8K UHD need high-speed driving, and thus, a one-line scanning time which is a time for which the gate signal is supplied to one gate line is shortened. The one-line scanning time corresponds to a data voltage supply period of each pixel. Therefore, if the one-line scanning time is shortened, a desired data voltage is not charged into each pixel, causing the degradation in image quality. In order to solve such a problem, a TFT having high electron mobility should be used as a switching element.

In a case where a TFT including an oxide-based semiconductor layer is used as a switching element, the manufacturing cost is reduced and electron mobility is low in comparison with a case where a TFT including a polysilicon-based semiconductor layer is used as a switching element. Therefore, high-resolution flat panel display devices requiring high-speed driving need the TFT including the oxide-based semiconductor layer.

However, the oxide-based semiconductor layer of the TFT applied to the high-resolution flat panel display devices requiring high-speed driving should be implemented as a short channel due to pixels per inch (PPI) as well as high electron mobility. In the related art, a TFT based on a semiconductor layer including indium-gallium-zinc oxide (IGZO) is used, and due to this, it is difficult to secure high electron mobility. Also, if the semiconductor layer including IGZO is used as a single layer, a threshold voltage is rapidly shifted due to a channel length variation of a channel. For this reason, it is difficult to implement a short channel in a state of maintaining a desired threshold voltage value.

FIG. 1 is a graph showing a drain-source current with respect to a gate-source voltage when a channel length varies, in a TFT including an IGZO-based semiconductor layer.

FIG. 1 shows an experiment result obtained by measuring a drain-source current with respect to a gate-source voltage under a condition where a channel length of a TFT including an IGZO-based semiconductor layer which is a single layer is changed to 4 μm to 10 μm. As shown in FIG. 1, it can be seen that in a case where the channel length is shortened to 4 μm or less, the threshold voltage is negative-shifted by about −5 V in comparison with a case where the channel length is 5 μm to 10 μm. Accordingly, if the channel length is shortened to 4 μm or less, it is difficult to secure a desired driving characteristic.

If power, pressure, and a temperature of a manufacturing apparatus are adjusted to a certain range in a process of depositing the IGZO-based semiconductor layer which is a single layer, a problem where a threshold voltage is negative-shifted in a short channel as in FIG. 1 is solved. In this case, however, a degree of freedom considered for other factors such as film uniformity is considerably reduced due to conditions such as the power, pressure, and temperature of the manufacturing apparatus.

Therefore, high-resolution flat panel display devices requiring high-speed driving need a TFT including an oxide semiconductor layer without limiting a degree of freedom of a manufacturing apparatus.

BRIEF SUMMARY

Accordingly, the present disclosure is directed to provide a TFT, a gate driver including the same, and a display device including the gate driver that substantially obviate one or more problems due to limitations and disadvantages of the related art.

An aspect of the present disclosure is directed to provide a TFT including an oxide semiconductor layer capable of being applied to high-resolution flat panel display devices requiring high-speed driving, a gate driver including the TFT, and a display device including the gate driver.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a TFT including a first oxide semiconductor layer including indium (In), gallium (Ga), zinc (Zn), tin (Sn) and oxygen (O) and a second oxide semiconductor layer including indium (In), gallium (Ga), zinc (Zn) and oxygen (O). A content ratio (Ga/In) of gallium (Ga) to indium (In) of the second oxide semiconductor layer is higher than a content ratio (Ga/In) of Ga to In of the first oxide semiconductor layer, and a content ratio (Zn/In) of zinc (Zn) to In of the second oxide semiconductor layer is higher than a content ratio (Zn/In) of Zn to In of the first oxide semiconductor layer.

In another aspect of the present disclosure, there is provided a gate driver including a plurality of stages outputting gate signals. The plurality of stages each includes the TFT according to an embodiment of the present disclosure.

In another aspect of the present disclosure, there is provided a display device including a display panel including a plurality of data lines, a plurality of gate lines, and a plurality of pixels respectively provided in a plurality of areas defined by intersections of the plurality of data lines and the plurality of gate lines. The plurality of pixels each includes the TFT.

It is to be understood that both the foregoing general description and the following detailed description of the present disclosure are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings:

FIG. 13 shows images of cross-sectional surfaces of a first oxide semiconductor layer and a second oxide semiconductor layer with respect to a temperature of a first substrate in a process of depositing the first oxide semiconductor layer and the second oxide semiconductor layer;

DETAILED DESCRIPTION

Figure 1:
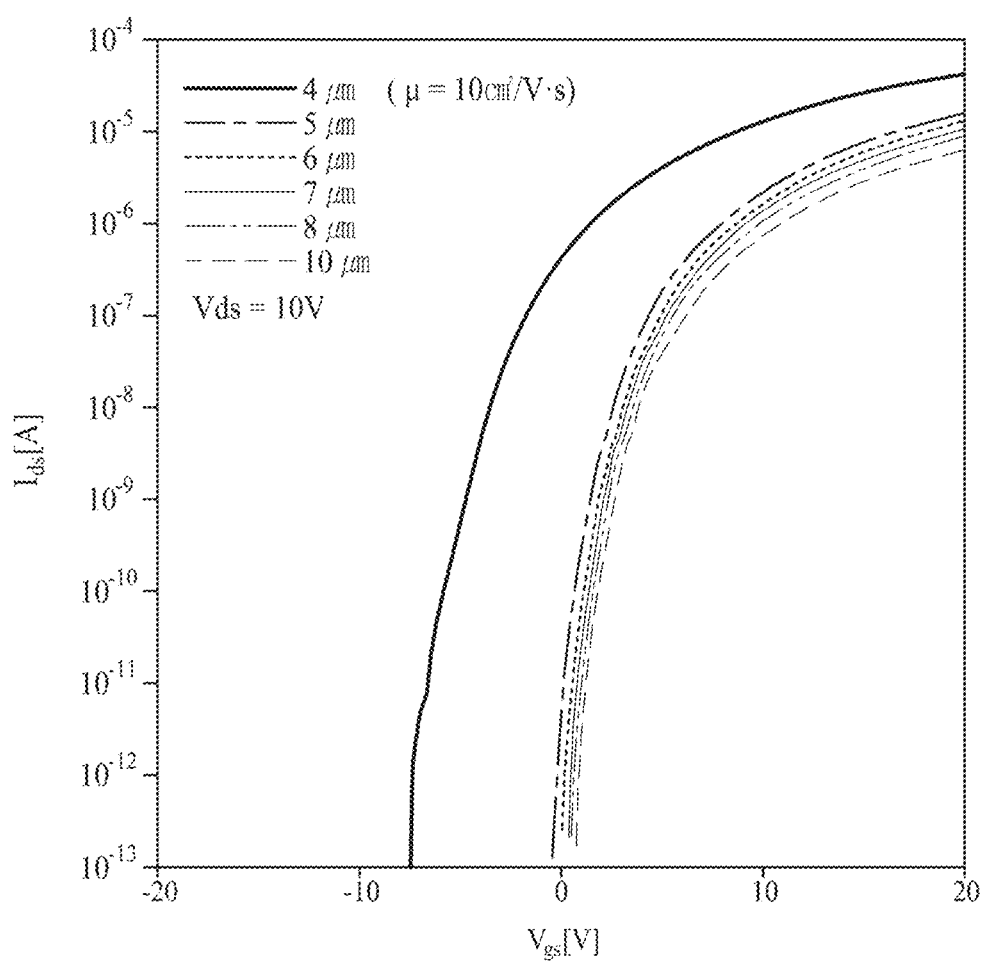
FIG. 1 is a graph showing a drain-source current with respect to a gate-source voltage when a channel length varies, in a TFT including a IGZO-based semiconductor layer.

Reference will now be made in detail to the exemplary embodiments of the present disclosure, examples of which are illustrated in the accompanying drawings. Wherever possible, the same reference numbers will be used throughout the drawings to refer to the same or like parts.

In the specification, like reference numerals refer to like elements. In the following description, when the detailed description of the relevant known function or configuration is determined to unnecessarily obscure the important point of the present disclosure, the detailed description will be omitted. A name of each of elements used herein is selected in consideration of easiness of description of the specification and may differ from a name of an actual product.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In construing an element, the element is construed as including an error range although there is no explicit description.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, exemplary embodiments of the present disclosure will be described in detail with reference to the accompanying drawings.

An example where a display device according to an embodiment of the present disclosure is a light emitting display device will be described below, but embodiments of the present disclosure are not limited thereto. The display device according to an embodiment of the present disclosure may be implemented as one of a liquid crystal display (LCD) device, a light emitting display device, a field emission display device, and an electrophoresis display device. Examples of the light emitting display device include organic light emitting display devices, which use an organic light emitting diode (OLED) as a light emitting element, and light emitting diode display devices which use a micro light emitting diode as a light emitting element.

Figure 2:
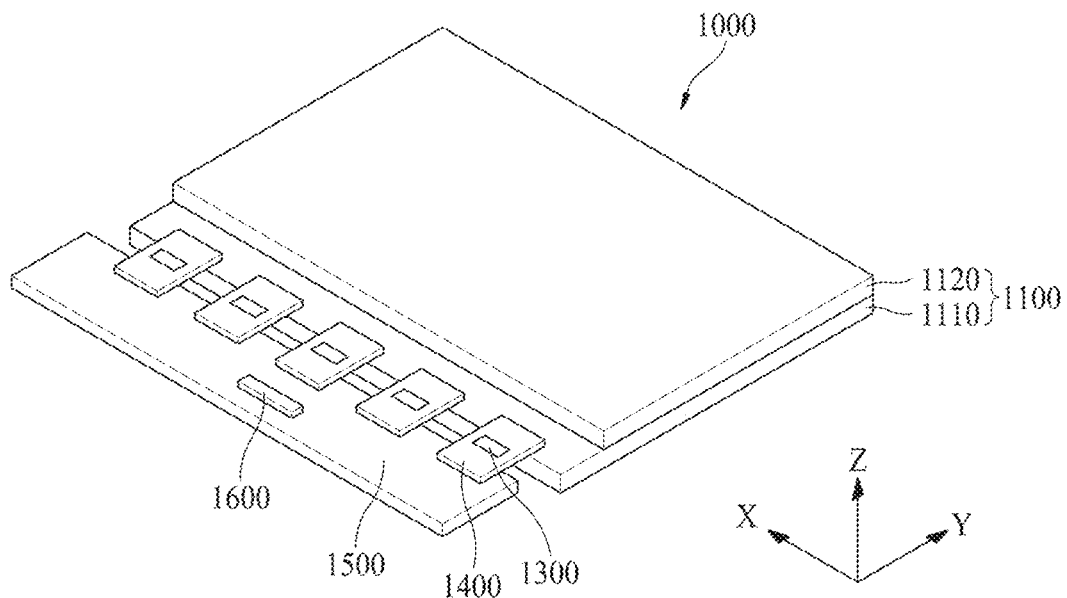
FIG. 2 is a perspective view illustrating a display device according to an embodiment of the present disclosure.
Figure 3:
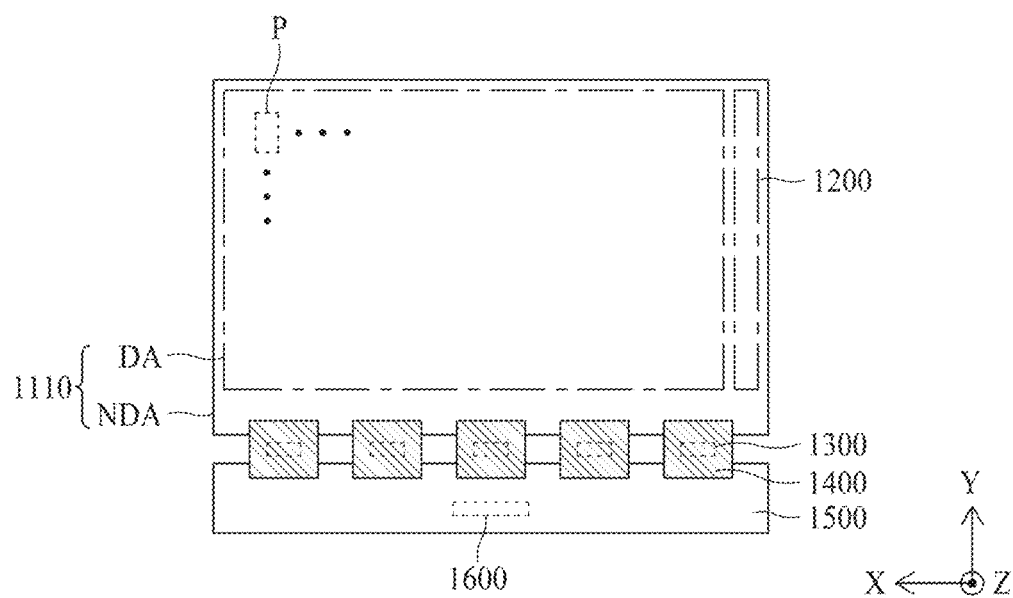
FIG. 3 is a plan view illustrating a first substrate, a gate driver, a source drive integrated circuit (IC), a flexible film, a circuit board, and a timing controller illustrated in FIG. 2.

FIG. 2 is a perspective view illustrating a display device according to an embodiment of the present disclosure. FIG. 3 is a plan view illustrating a first substrate, a gate driver, a source drive integrated circuit (IC), a flexible film, a circuit board, and a timing controller illustrated in FIG. 2.

Referring to FIGS. 2 and 3, an organic light emitting display device 1000 according to an embodiment of the present disclosure may include a display panel 1100, a gate driver 1200, a data driver, a flexible film 1400, a circuit board 1500, and a timing controller 1600.

The display panel 1100 may include a first substrate 1110 and a second substrate 1120. The first substrate 1110 and the second substrate 1120 may each be plastic, glass, or the like. For example, if the first substrate 1110 is plastic, the first substrate 1110 may be formed of polyimide, polyethylene terephthalate (PET), polyethylene naphthalate (PEN), polycarbonate (PC), and/or the like. If the first substrate 1110 is formed of plastic, the organic light emitting display device 1000 may be implemented as a flexible display device capable of being bent or curved. The second substrate 1120 may be one of glass, a plastic film, and an encapsulation film.

The first substrate 1110 may be a TFT substrate on which a plurality of TFTs are provided. A plurality of gate lines, a plurality of data lines, and a plurality of pixels P may be provided on one surface of the first substrate 1110 facing the second substrate 1120. The pixels P may be respectively provided in a plurality of areas defined by an intersection structure of the gate lines and the data lines. The display panel 1100, as in FIG. 3, may be divided into a display area DA where the pixels P are provided to display an image and a non-display area NDA which does not display an image. The gate lines, the data lines, and the pixels P may be provided in the display area DA. The gate driver 1200, a plurality of pads, and a plurality of link lines connecting the data lines to the pads may be provided in the non-display area NDA.

Each of the pixels P may include, as a switching element, at least one transistor which is turned on by a gate signal of a corresponding gate line and transfers a data voltage of a corresponding data line to an element of a corresponding pixel P. The transistor may be a TFT.

Figure 4:
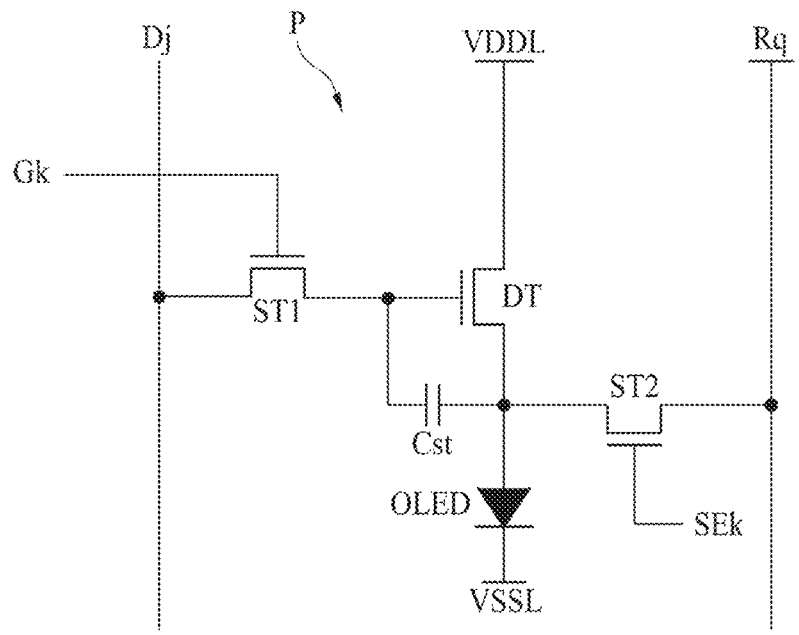
FIG. 4 is a circuit diagram illustrating a pixel of FIG. 3.

For example, as in FIG. 4, each of the pixels P may include an organic light emitting diode OLED, a driving transistor DT, a plurality of switching transistors ST1 and ST2, and a capacitor Cst. The plurality of switching transistors ST1 and ST2 may include first and second switching transistors ST1 and ST2. In FIG. 4, for convenience of description, only a pixel P connected to a jth (where j is an integer equal to or more than two) data line Dj, a qth (where q is an integer equal to or more than two) reference voltage line Rq, a kth (where k is an integer equal to or more than two) gate line Gk, and a kth initialization line SEk is illustrated.

The organic light emitting diode OLED may emit light with a current supplied through the driving transistor DT. An anode electrode of the organic light emitting diode OLED may be connected to a source electrode of the driving transistor DT, and a cathode electrode may be connected to a first source voltage line VSSL through which a first source voltage is supplied. The first source voltage line VSSL may be a low level voltage line through which a low-level source voltage is supplied.

The organic light emitting diode OLED may include an anode electrode, a hole transporting layer, an organic light emitting layer, an electron transporting layer, and a cathode electrode. In the organic light emitting diode OLED, when a voltage is applied to the anode electrode and the cathode electrode, a hole and an electron may respectively move to the organic light emitting layer through the hole transporting layer and the electron transporting layer and may be combined in the organic light emitting layer to emit light.

The driving transistor DT may be disposed between the organic light emitting diode OLED and a second source voltage line VDDL through which a second source voltage is supplied. The driving transistor DT may control a current flowing from the second source voltage line VDDL to the organic light emitting diode OLED, based on a voltage difference between the source electrode and a gate electrode thereof. The gate electrode of the driving transistor DT may be connected to a first electrode of the first switching transistor ST1, the drain electrode may be connected to the second source voltage line VDDL, and a source electrode may be connected to the anode electrode of the organic light emitting diode OLED. The second source voltage line VDDL may be a high level voltage line through which a high-level source voltage is supplied.

The first switching transistor ST1 may be turned on by a kth gate signal of the kth gate line Gk and may supply a data voltage of the jth data line Dj to the gate electrode of the driving transistor DT. A gate electrode of the first switching transistor ST1 may be connected to the kth gate line Gk, a source electrode may be connected to the gate electrode of the driving transistor DT, and a drain electrode may be connected to the jth data line Dj.

The second switching transistor ST2 may be turned on by a kth initialization signal of the kth initialization line SEk and may connect the qth reference voltage line Rq to the source electrode of the driving transistor DT. A gate electrode of the second switching transistor ST2 may be connected to the kth initialization line SEk, a first electrode may be connected to the qth reference voltage line Rq, and a second electrode may be connected to the source electrode of the driving transistor DT.

The capacitor Cst may be provided between the gate electrode and the source electrode of the driving transistor DT. The capacitor Cst may store a difference voltage between a gate voltage and a source voltage of the driving transistor DT.

One electrode of the capacitor Cst may be connected to the gate electrode of the driving transistor DT and the source electrode of the first switching transistor ST1, and the other electrode may be connected to the source electrode of the driving transistor DT, the drain electrode of the second switching transistor ST2, and the anode electrode of the organic light emitting diode OLED.

In FIG. 4, the driving transistor DT, the first switching transistor ST1, and the second switching transistor ST2 of each of the pixels P may each be a TFT. Also, in FIG. 4, an example where the driving transistor DT, the first switching transistor ST1, and the second switching transistor ST2 of each of the pixels P are each implemented as an N-type semiconductor transistor having an N-type semiconductor characteristic is illustrated, but embodiments of the present disclosure are not limited thereto. In other embodiments, the driving transistor DT, the first switching transistor ST1, and the second switching transistor ST2 of each of the pixels P are each implemented as a P-type semiconductor transistor having a P-type semiconductor characteristic.

The gate driver 1200 may supply gate signals to the gate lines according to a gate control signal input from the timing controller 1600. The gate driver 1200 may be provided as a gate driver in panel (GIP) type in the non-display area NDA outside one side or both sides of the display area DA of the display panel 1100. In this case, the gate driver 1200 may include a plurality of transistors, for outputting the gate signals to the gate lines according to the gate control signal. Here, each of the plurality of transistors may be a TFT.

Figure 5:
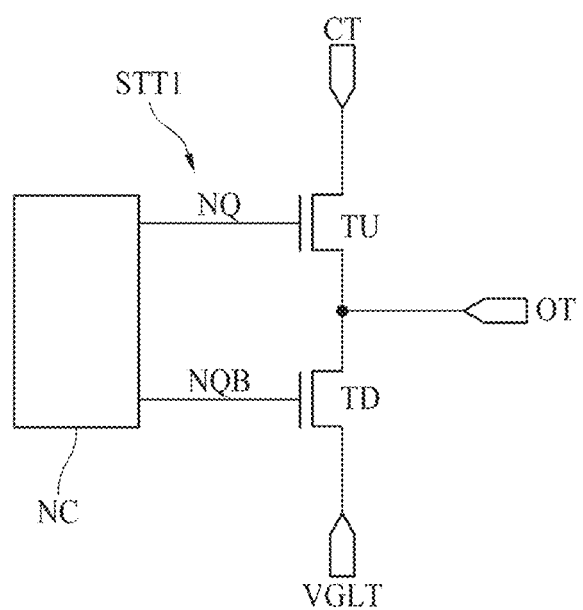
FIG. 5 is a circuit diagram illustrating a portion of the gate driver of FIG. 3.

For example, as in FIG. 5, the gate driver 1200 may include a plurality of stages STT1 which are dependently connected to one another, and the stages STT1 may sequentially output the gate signals to the gate lines.

The stages STT1, as in FIG. 5, may each include a pull-up node NQ, a pull-down node NQB, a pull-up transistor TU which is turned on when the pull-up node NQ is charged with a gate high voltage, a pull-down transistor TD which is turned on when the pull-down node NQB is charged with the gate high voltage, and a node controller NC for controlling charging or discharging of the pull-up node NQ and the pull-down node NQB.

The node controller NC may be connected to a start signal line, through which a start signal or a carry signal of a front-end stage is input, and a clock line through which one of gate clock signals is input. The node controller NC may control charging or discharging of the pull-up node NQ and the pull-down node NQB according to the start signal or the carry signal of the front-end stage input through the start signal line and a gate clock signal input through the clock line. In order to stably control an output of the stage STT1, when the pull-up node NQ is charged with the gate high voltage, the node controller NC may discharge the pull-down node NQB to a gate low voltage, and when the pull-down node NQB is charged with the gate high voltage, the node controller NC may discharge the pull-up node NQ to the gate low voltage. To this end, the node controller NC may include a plurality of transistors.

When the stage STT1 is pulled up, namely, when the pull-up node NQ is charged with the gate high voltage, the pull-up transistor TU may be turned on and may output a gate clock signal of a clock line CL to an output terminal OT. When the stage STT1 is pulled down, namely, when the pull-down node NQB is charged with the gate high voltage, the pull-down transistor TD may be turned on and may discharge the output terminal OT to a gate low voltage of a gate low voltage terminal VGLT.

In FIG. 5, the pull-up transistor TU, the pull-down transistor TD, and the plurality of transistors of the node controller NC of each of the stages STT1 included in the gate driver 1200 may each be implemented as a TFT. Also, in FIG. 5, an example where the pull-up transistor TU, the pull-down transistor TD, and the plurality of transistors of the node controller NC of each of the stages STT1 included in the gate driver 1200 are each implemented as an N-type semiconductor transistor having the N-type semiconductor characteristic is illustrated, but embodiments of the present disclosure. In other embodiments, the pull-up transistor TU, the pull-down transistor TD, and the plurality of transistors of the node controller NC of each of the stages STT1 included in the gate driver 1200 are each implemented as a P-type semiconductor transistor having the P-type semiconductor characteristic.

The gate driver 1200 may be implemented as a driving chip like an integrated circuit (IC). In this case, the gate driver 1200 may be mounted on a gate flexible film in a chip-on film (COF) type, and the gate flexible film may be attached on the first substrate 1110 of the display panel 1100.

The data driver may include at least one source drive IC 1300. The source drive IC 1300 may receive digital video data and a source control signal from the timing controller 1600. The source drive IC 1300 may convert the digital video data into analog data voltages according to the source control signal and may respectively supply the data voltages to the data lines.

In a case where the source drive IC 1300 is implemented as a driving chip like an IC, the source drive IC 1300 may be mounted on the flexible film 1400 as in FIGS. 2 and 3. A plurality of lines connecting the pads to the source drive IC 1300 and a plurality of lines connecting the pads to lines of the circuit board 1500 may be provided on the flexible film 1400. The flexible film 1400 may be attached on the pads such as data pads provided in the non-display area NDA of the display panel 110 by using an anisotropic conductive film, and thus, the pads may be connected to the lines of the flexible film 1400. Alternatively, the source drive IC 1300 may be directly attached on pads of the first substrate 1110 of the display panel 1100 in a chip-on glass (COG) type or a chip-on plastic (COP) type.

The flexible film 1400 may be provided in plurality, and the circuit board 1500 may be attached on the flexible films 1400. A plurality of circuits respectively implemented as driving chips may be mounted on the circuit board 1500. For example, the timing controller 1600 may be mounted on the circuit board 1500. The circuit board 1500 may be a printed circuit board (PCB) or a flexible PCB (FPCB).

The timing controller 1600 may receive the digital video data and a timing signal from an external system board through a cable of the circuit board 1500. The timing controller 1600 may generate the gate control signal for controlling an operation timing of the gate driver 1200 and the source control signal for controlling the source drive IC 1300 which is provided in plurality, based on the timing signal. The timing controller 1600 may supply the gate control signal to the gate driver 1200 and may supply the source control signal to the source drive ICs 1300.

As described above, in the display device according to an embodiment of the present disclosure, each of the pixels P may include at least one TFT as a switching element, and in a case where the gate driver 1200 is implemented as the GIP type, the gate driver 1200 may include a plurality of transistors, for sequentially outputting the gate signals to the gate lines. Therefore, in display devices which require high-speed driving due to a high resolution, an electron mobility of each of the plurality of transistors included in the gate driver 1200 should increase in order for the gate driver 1200 to stably output the gate signals.

Hereinafter, a TFT including an oxide semiconductor layer capable of being applied to the transistors of the gate driver 1200 and the transistors of the pixels P of the display device which requires high-speed driving due to a high resolution, according to an embodiment of the present disclosure, will be described in detail.

Figure 6:
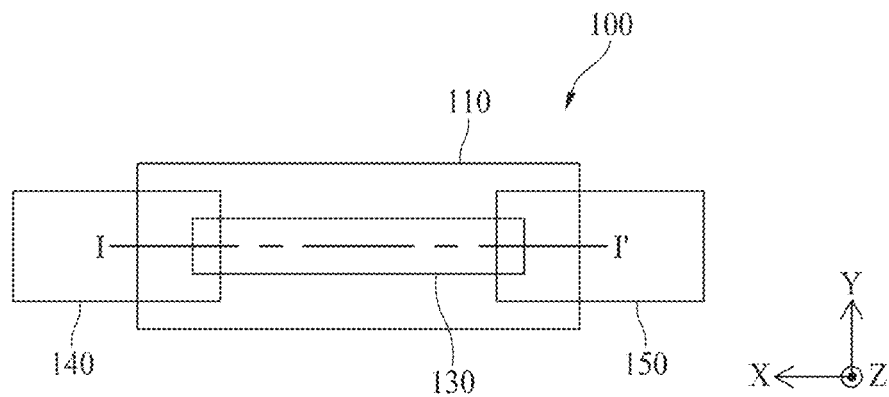
FIG. 6 is a plan view illustrating a TFT according to an embodiment of the present disclosure.
Figure 7:
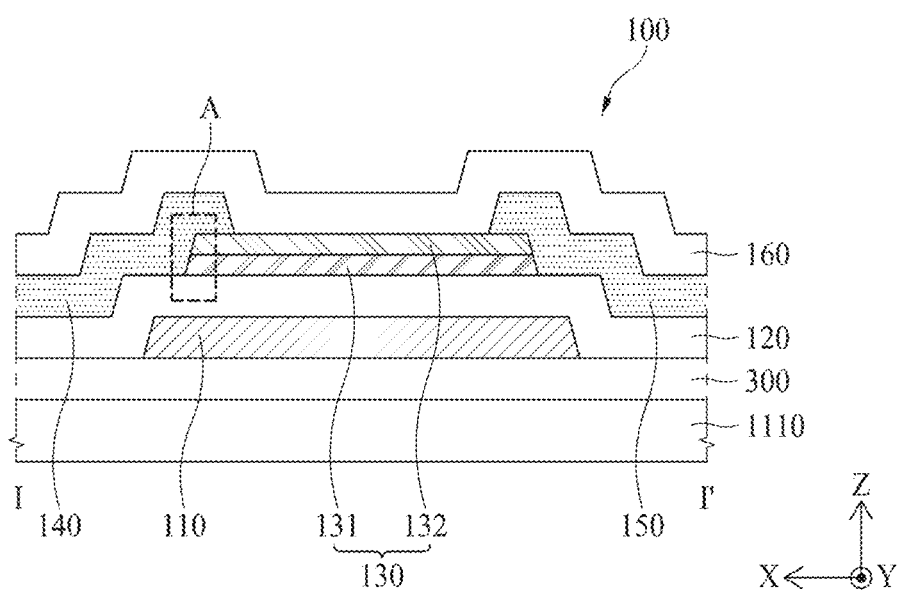
FIG. 7 is a cross-sectional view illustrating an example taken along line I-I' of FIG. 6.

FIG. 6 is a plan view illustrating a TFT 100 according to an embodiment of the present disclosure. FIG. 7 is a cross-sectional view illustrating an example taken along line I-I' of FIG. 6.

In FIGS. 6 and 7, an example where a TFT according to an embodiment of the present disclosure is implemented in an inverted staggered structure using a back channel etched (BCE) process is illustrated. The inverted staggered structure may have a bottom gate structure where a gate electrode is provided under an active layer.

Referring to FIGS. 6 and 7, the TFT 100 according to an embodiment of the present disclosure may include a gate electrode 110, an oxide semiconductor layer 130, a source electrode 140, and a drain electrode 150.

The TFT 100 may be provided on a first substrate 1110. The first substrate 1110 may be formed of plastic, glass, and/or the like.

A buffer layer 300 may be provided on the first substrate 1110, for protecting the TFT 100 from water penetrating through the first substrate 1110. The buffer layer 300 may include a plurality of inorganic layers which are alternately stacked. For example, the buffer layer 300 may be formed of a multilayer where one or more inorganic layers of silicon oxide (SiOx), silicon nitride (SiNx), and SiON are alternately stacked. The buffer layer 300 may be omitted.

The gate electrode 110 may be provided on the buffer layer 300. The gate electrode 110 may be provided to have an area which is wider than that of the oxide semiconductor layer 130, in order to block light which is incident on the oxide semiconductor layer 130 from the first substrate 1110, and thus, the gate electrode 110 may cover the oxide semiconductor layer 130. Therefore, the oxide semiconductor layer 130 may be protected from the light incident from the first substrate 1110. The gate electrode 110 may be formed of a single layer or a multilayer which includes one of molybdenum (Mo), aluminum (Al), chromium (Cr), gold (Au), titanium (Ti), nickel (Ni), neodymium (Nd), and copper (Cu), or an alloy thereof.

A gate insulation layer 120 may be provided on the gate electrode 110. The gate insulation layer 120 may be formed of an inorganic layer, and for example, may be formed of SiOx, SiNx, or a multilayer thereof.

The oxide semiconductor layer 130 may be provided on the gate insulation layer 120. The oxide semiconductor layer 130 may be disposed to overlap the gate electrode 110 with the gate insulation layer 120 therebetween.

The oxide semiconductor layer 130 may include a first oxide semiconductor layer 131 and a second oxide semiconductor layer 132. The first oxide semiconductor layer 131 may be a main channel layer through which an electron moves, and thus, may be disposed close to the gate electrode 110. Therefore, the first oxide semiconductor layer 131 may be defined as a layer which is disposed closer to the gate electrode 110 than the second oxide semiconductor layer 132, and the second oxide semiconductor layer 132 may be defined as a layer which is disposed farther away from the gate electrode 110 than the first oxide semiconductor layer 131. For example, in a case where the TFT 100 is implemented in the inverted staggered structure as in FIGS. 6 and 7, since the gate electrode 110 is disposed under the oxide semiconductor layer 130, the first oxide semiconductor layer 131 may be disposed on the gate insulation layer 120, and the second oxide semiconductor layer 132 may be disposed on the first oxide semiconductor layer 131.

The source electrode 140 may directly contact one side of the second oxide semiconductor layer 132 and one side of the first oxide semiconductor layer 131 which is the main channel layer. In detail, the source electrode 140 may directly contact one side surface of the first oxide semiconductor layer 131 and one side surface and a portion of an upper surface of the second oxide semiconductor layer 132. Also, the drain electrode 150 may directly contact the other side of the first oxide semiconductor layer 131 and the other side of the second oxide semiconductor layer 132. In detail, the drain electrode 150 may directly contact the other side surface of the first oxide semiconductor layer 131 and the other side surface and a portion of the upper surface of the second oxide semiconductor layer 132. The source electrode 140 and the drain electrode 150 may each be formed of a single layer or a multilayer which includes one of Mo, Al, Cr, Au, Ti, Ni, Nd, and Cu, or an alloy thereof.

A passivation layer 160 may be provided on the oxide semiconductor layer 130, the source electrode 140, and the drain electrode 150. The passivation layer 160 may be formed of an inorganic layer, and for example, may be formed of SiOx, SiNx, or a multilayer thereof.

The first oxide semiconductor layer 131 may consist of indium-gallium-zinc-tin oxide (IGZTO) instead of indium-gallium-zinc oxide (IGZO), for increasing electron mobility. In more detail, an electron mobility of the first oxide semiconductor layer 131 may be adjusted to 15 cm$^2$/V·s or more, and in order to satisfy a positive bias temperature stress (PBTS) characteristic and a negative bias temperature illumination stress (NBTIS) characteristic, a content of indium-gallium-zinc-tin (IGZT) should satisfy the following conditions. In the first oxide semiconductor layer 131, a content ratio of indium (In) to tin (Sn) may be 2.5≤In/Sn≤5, a content ratio of gallium (Ga) to Sn may be 1≤Ga/Sn≤2, and a content ratio of zinc (Zn) to Sn may be 2.5≤Zn/Sn≤5. A condition which satisfies the PBTS characteristic and the NBTIS characteristic may represent a case where a threshold voltage shift value is within a range of −5 V to 2 V. Here, a content of each element is represented as an atomic percent.

However, if the oxide semiconductor layer 130 is formed of a single layer based on IGZTO, a threshold voltage may be shifted based on a variation of a channel length, and due to this, it is difficult to implement a short channel in a state of maintaining a desired threshold voltage value. That is, if the oxide semiconductor layer 130 is formed of a single layer based on IGZTO, it is difficult to implement a short channel and secure a desired driving characteristic due to an influence of a channel length variation (CLV). The CLV may denote a degree to which a threshold voltage is shifted based on a variation of a channel length.

Therefore, in order to prevent a threshold voltage from being shifted in a case where the oxide semiconductor layer 130 is implemented as a short channel, the oxide semiconductor layer 130 may further include the second oxide semiconductor layer 132 including indium-gallium-zinc oxide (IGZO). For example, the second oxide semiconductor layer 132 may consist of IGZO or IGZTO. In a case where the second oxide semiconductor layer 132 is formed of IGZTO, a composition ratio of IGZT of the second oxide semiconductor layer 132 may differ from that of IGZT of the first oxide semiconductor layer 131.

Figure 8:
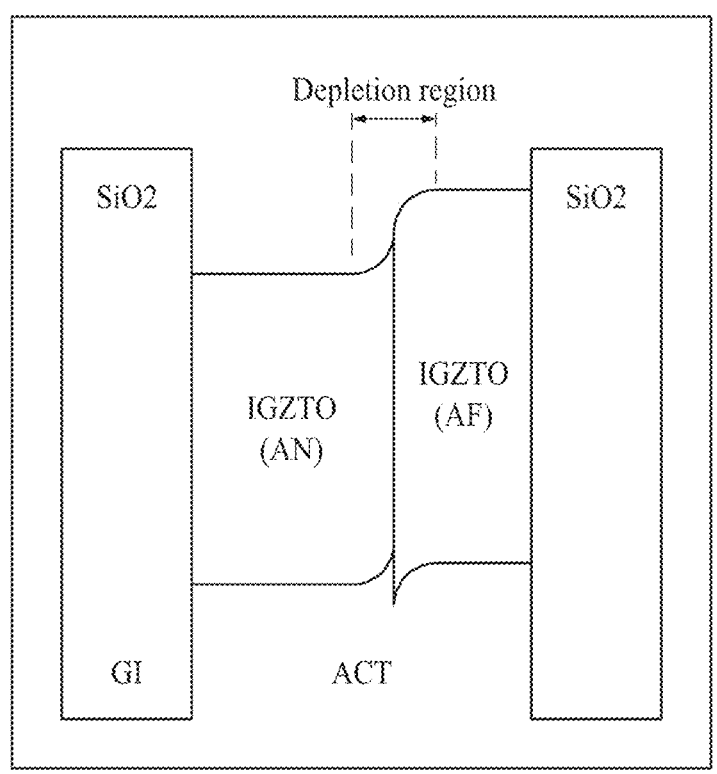
FIG. 8 is an exemplary diagram for describing an oxide semiconductor layer of a TFT according to an embodiment of the present disclosure.

In a case where the oxide semiconductor layer 130 includes the first oxide semiconductor layer 131 including IGZTO and the second oxide semiconductor layer 133 including IGZO or IGZTO having a composition ratio which differs from that of the first oxide semiconductor layer 131, the oxide semiconductor layer 130 may have a heterojunction structure as in FIG. 8. Here, a depletion region caused by a built-in potential is formed in a junction portion between the first oxide semiconductor layer 131 and the second oxide semiconductor layer 132 due to a Fermi energy level difference between thin layers, and the built-in potential causes band bending in the junction portion. The oxide semiconductor layer 130 may control a total charge density because including the depletion region, thereby preventing a threshold voltage from being shifted based on a channel length. That is, in an embodiment of the present disclosure, since the second oxide semiconductor layer 132 is provided, an increase in a charge density is effectively controlled in the oxide semiconductor layer 130 formed of a high-mobility thin layer, thereby preventing a threshold voltage from being shifted based on a variation of a channel length of the oxide semiconductor layer 130. As a result, in an embodiment of the present disclosure, electron mobility increases, and moreover, a device characteristic of a TFT is secured.

Moreover, a bonding force between Sn and oxygen is stronger than a bonding force between In and oxygen. Therefore, in a case where the second oxide semiconductor layer 132 is formed of IGZTO, a chemical resistance increases, and moreover, oxygen vacancy is reduced in comparison with a case where the second oxide semiconductor layer 132 is formed of IGZO. Therefore, the PBTS characteristic and NBTIS characteristic of the TFT including the second oxide semiconductor layer 132 formed of IGZTO are improved, and the reliability of the TFT is enhanced.

Figure 9:
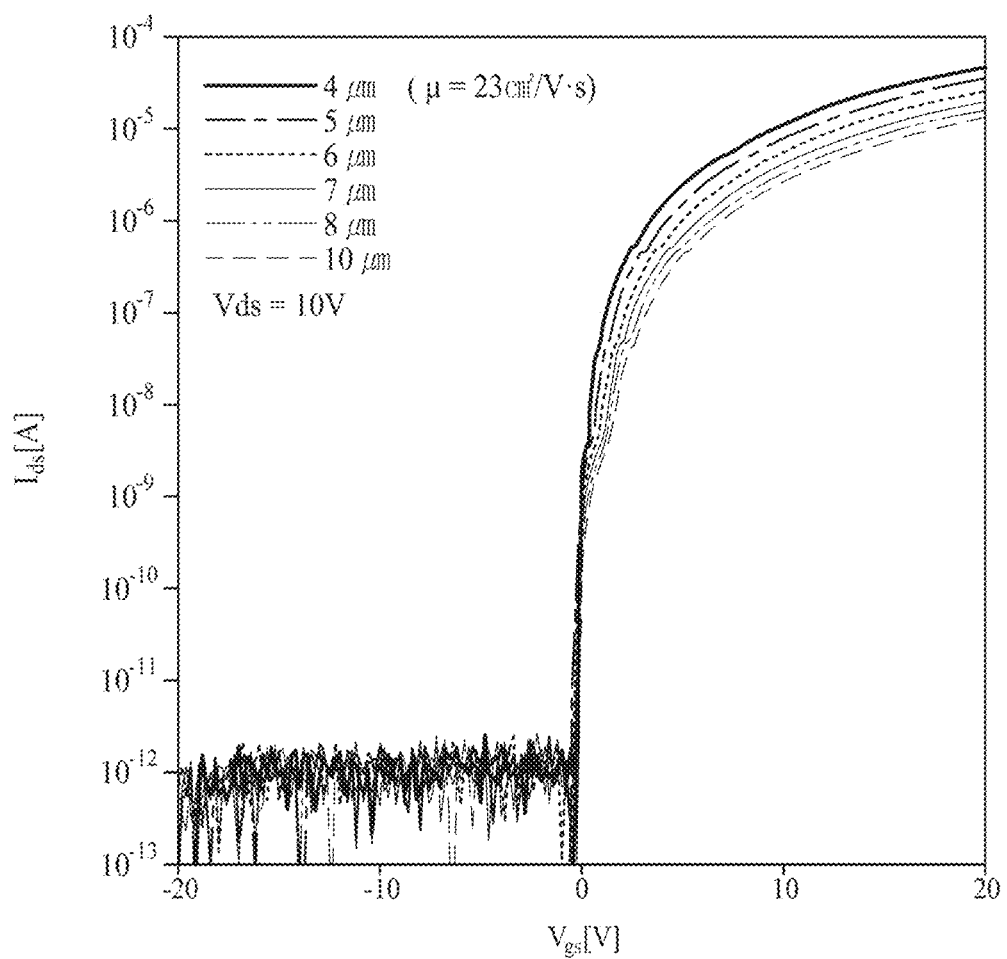
FIG. 9 is a graph showing a drain-source current with respect to a gate-source voltage when a channel length varies, in a TFT according to an embodiment of the present disclosure.

FIG. 9 is a graph showing a drain-source current with respect to a gate-source voltage when a channel length varies, in a TFT according to an embodiment of the present disclosure. FIG. 9 shows an experiment result obtained by measuring a drain-source current with respect to a gate-source voltage while changing a channel length to 4 μm to 10 μm, in the TFT including the first oxide semiconductor layer 131 and the second oxide semiconductor layer 132. For example, the experiment result of FIG. 9 has been obtained by performing an experiment under a condition where a drain-source voltage Vds is set to 10 V, a composition ratio of IGZT of the first oxide semiconductor layer 131 is set to 4:1:4:1, and a composition ratio of IGZT of the second oxide semiconductor layer 132 is set to 4:12:16:1. That is, in FIG. 9, an example where the second oxide semiconductor layer 132 is formed of IGZTO is shown.

Referring to FIG. 9, it can be seen that in the TFT according to an embodiment of the present disclosure, a threshold voltage is hardly shifted with respect to a variation of a channel length. That is, in the TFT according to an embodiment of the present disclosure, a short channel is implemented, and a desired threshold voltage is maintained, whereby a desired device characteristic of the TFT is secured.

Moreover, as in FIG. 9, if a channel of the oxide semiconductor layer 130 has a width of 4 μm and a length of 4 μm, electron mobility may be about 23 $cm^2/V \times s$. The electron mobility has a high numerical value in comparison with a case where in the same channel width and channel length, an electron mobility of a TFT including an IGZO-based semiconductor layer is about 10 $cm^2/V \times s$ as in FIG. 1. As described above, in the TFT according to an embodiment of the present disclosure, even when the oxide semiconductor layer is implemented as a short channel, a threshold voltage is not shifted, and electron mobility is considerably enhanced.

Moreover, the second oxide semiconductor layer 132 may not act as a channel but may cap and protect the first oxide semiconductor layer 131 in order for the first oxide semiconductor layer 131 to stably act as a channel. To this end, a content ratio (Ga/Sn) of Ga to Sn of the second oxide semiconductor layer 132 may be higher than a content ratio (Ga/Sn) of Ga to Sn of the first oxide semiconductor layer 131. Alternatively, the second oxide semiconductor layer 132 may be formed of IGZO and may not include Sn. In this case, the second oxide semiconductor layer 132 may be lower in conductivity than the first oxide semiconductor layer 131 and may be greater in band gap than the first oxide semiconductor layer 131.

Figure 10:
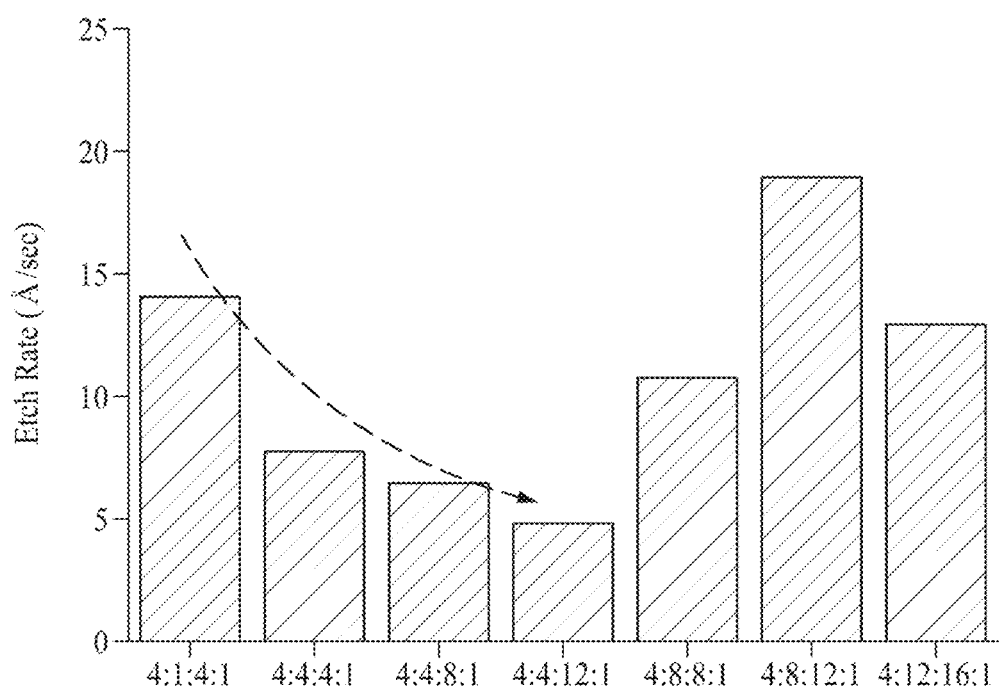
FIG. 10 is a graph showing a variation of an etch rate with respect to a variation of each of a gallium (Ga) content and a zinc (Zn) content of a second oxide semiconductor layer.

FIG. 10 is a graph showing an etch rate with respect to a variation of each of a Ga content and a Zn content of a second oxide semiconductor layer.

FIG. 10 shows a result obtained by measuring an etch rate under the same condition while sequentially changing a composition ratio of IGZT of the second oxide semiconductor layer 132 to 4:1:4:1, 4:4:4:1, 4:8:4:1, 4:12:4:1, 4:8:8:1, 4:8:12:1, and 4:12:16:1. As in FIG. 10, if only a content of Ga increases in the second oxide semiconductor layer 132, an etch rate of the second oxide semiconductor layer 132 is lowered. For this reason, a time taken in etching the second oxide semiconductor layer 132 increases.

As in FIG. 10, if a content of Zn increases in the second oxide semiconductor layer 132, an etch rate of the second oxide semiconductor layer 132 increases. Therefore, in order to prevent an etch time of the second oxide semiconductor layer 132 from increasing, a content of Zn should increase along with a content of Ga. Therefore, a content ratio (Ga/In) of Ga to In of the second oxide semiconductor layer 132 may be higher than a content ratio (Ga/In) of Ga to In of the first oxide semiconductor layer 131. Also, a content ratio (Zn/In) of Zn to In of the second oxide semiconductor layer 132 may be higher than a content ratio (Zn/In) of Zn to In of the first oxide semiconductor layer 131.

In order to check a device characteristic with respect to a content variation of each of Ga and Zn of the second oxide semiconductor layer 132, a composition ratio of IGZT of the first oxide semiconductor layer 131 has been set to 4:1:4:1 as in Table 1, and a CLV and electron mobility have been measured while varying a content of each of Ga and Zn of the second oxide semiconductor layer 132. In Table 1, the CLV denotes a difference between a threshold voltage of when a channel length is 4 μm and a threshold voltage of when a channel length is 12 μm. The CLV being small denotes that a variation of a threshold voltage is small with respect to a variation of a channel length.

TABLE 1

| First oxide semiconductor | 4:1:4:1 |
|---|---|

TABLE 1-continued

| layer (In:Ga:Zn:Sn) | | | | | | |
|---|---|---|---|---|---|---|
| Second oxide semiconductor layer (In:Ga:Zn:Sn) | 4:4:4:1 | 4:8:4:1 | 4:12:4:1 | 4:8:8:1 | 4:8:12:1 | 4:12:16:1 |
| CLV (L = 12-4 µm) | 1.34 | 0.54 | 0.34 | 0.37 | 0.38 | 0.21 |
| Mobility (L = 4 µm) | 33.3 | 21.9 | 23.6 | 20.5 | 25.2 | 20.7 |

Referring to Table 1, when a content of Ga of the second oxide semiconductor layer 132 increases, a CLV value is lowered. Also, even when a content of Ga and a content of Zn increase for adjusting an etch rate, the CLV value is lowered, and an electron mobility of 20 cm$^2$/V×s is secured.

However, when a content of Zn increases continuously in the second oxide semiconductor layer 132, the PBTS characteristic and NBTIS characteristic of the TFT 100 are degraded, and a content of Zn should be designed in consideration of the degradation. A condition which satisfies the PBTS characteristic and the NBTIS characteristic may represent a case where a threshold voltage shift value is within a range of −5 V to 2 V. This will be described below in detail with reference to FIGS. 14A to 14C.

As described above, since the second oxide semiconductor layer 132 is formed of IGZO or IGZTO having a composition ratio which differs from that of the first oxide semiconductor layer 131, a threshold voltage is prevented from being shifted even when the oxide semiconductor layer 130 is implemented as a short channel, the second oxide semiconductor layer 132 caps and protects the first oxide semiconductor layer 131 in order for the first oxide semiconductor layer 131 to stably act as a channel, and an etch rate of the second oxide semiconductor layer 132 increases. In this case, if the second oxide semiconductor layer 132 is formed of IGZTO, a composition ratio of IGZT of the second oxide semiconductor layer 132 should satisfy the following conditions. In the second oxide semiconductor layer 132, a content ratio of Sn to In may be 0.1≤Sn/In≤0.5, a content ratio of Ga to In may be 2≤Ga/In≤4, and a content ratio of Zn to In may be 2≤Zn/In≤8. Further, if the second oxide semiconductor layer 132 is formed of IGZO, a composition ratio of IGZ of the second oxide semiconductor layer 132 should satisfy the following conditions. In the second oxide semiconductor layer 132, a content ratio of Ga to In may be 2≤Ga/In≤4, and a content ratio of Zn to In may be 2≤Zn/In≤8. Here, a content of each element is represented as an atomic percent.

Moreover, a content ratio of In to Sn of the second oxide semiconductor layer 132 may be substantially equal to or higher than a content ratio of In to Sn of the first oxide semiconductor layer 131. Also, a content ratio of Ga to Sn of the second oxide semiconductor layer 132 may be higher than a content ratio of Ga to Sn of the first oxide semiconductor layer 131. Also, a content ratio of Zn to Sn of the second oxide semiconductor layer 132 may be higher than a content ratio of Zn to Sn of the first oxide semiconductor layer 131.

Moreover, a content of In of the second oxide semiconductor layer 132 may be lower than a content of In of the first oxide semiconductor layer 131. Also, a content of Ga of the second oxide semiconductor layer 132 may be higher than a content of Ga of the first oxide semiconductor layer 131. Also, a content of Zn of the second oxide semiconductor layer 132 may be higher than a content of Zn of the first oxide semiconductor layer 131. Also, a content of Sn of the second oxide semiconductor layer 132 may be lower than a content of Sn of the first oxide semiconductor layer 131.

Figure 11A:
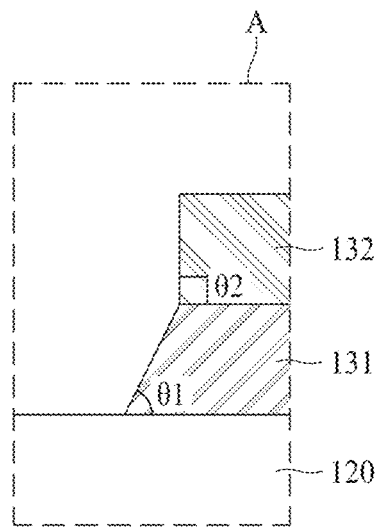
FIGS. 11A and 11B are enlarged cross-sectional views illustrating embodiments of a region A of FIG. 7.
Figure 11B:
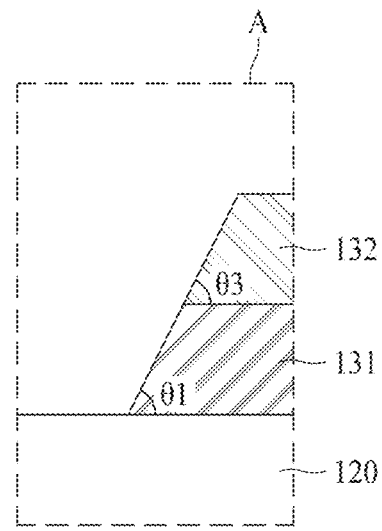

FIGS. 11A and 11B are enlarged cross-sectional views illustrating embodiments of a region A of FIG. 7.

Referring to FIGS. 11A and 11B, a slope of each of side surfaces of the first oxide semiconductor layer 131 may be formed at a first angle "θ1" which is an acute angle. A slope of each of side surfaces of the second oxide semiconductor layer 132 may be formed at a second angle "θ2" which is a right angle as in FIG. 11A, or may be formed at a third angle "θ3" which is an acute angle as in FIG. 11B.

Figure 12:
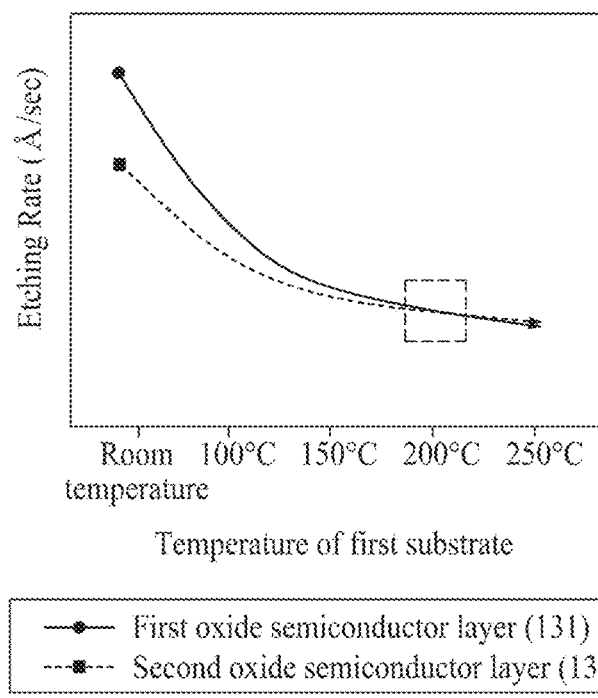
FIG. 12 is a graph showing an etch rate of each of a first oxide semiconductor layer and a second oxide semiconductor layer with respect to a temperature of a first substrate in a process of depositing the first oxide semiconductor layer and the second oxide semiconductor layer.

In detail, the oxide semiconductor layer 130 may include the first oxide semiconductor layer 131 including IGZTO and the second oxide semiconductor layer 132 including IGZO or IGZTO having a composition ratio which differs from that of the first oxide semiconductor layer 131. Therefore, as in FIG. 12, an etch rate of the first oxide semiconductor layer 131 and an etch rate of the second oxide semiconductor layer 132 differently vary with respect to a temperature of the first substrate 1110 in a process of depositing the first oxide semiconductor layer 131 and the second oxide semiconductor layer 132. In FIG. 12, the etch rate of the first oxide semiconductor layer 131 and the etch rate of the second oxide semiconductor layer 132 are shown with respect to the temperature of the first substrate 1110 in the process of depositing the first oxide semiconductor layer 131 and the second oxide semiconductor layer 132 under a condition where a composition ratio of IGZT of the first oxide semiconductor layer 131 is 4:1:4:1 and a composition ratio of IGZT of the second oxide semiconductor layer 132 is 4:12:16:1.

As in FIG. 12, when the temperature of the first substrate 1110 is lower than 200° C. in the process of depositing the first oxide semiconductor layer 131 and the second oxide semiconductor layer 132, an etch rate (A/sec) of the first oxide semiconductor layer 131 is higher than that of the second oxide semiconductor layer 132. In a case where the first oxide semiconductor layer 131 is disposed under the second oxide semiconductor layer 132 as in FIG. 7, if the etch rate of the first oxide semiconductor layer 131 is higher than that of the second oxide semiconductor layer 132, the slope of each of the side surfaces of the second oxide semiconductor layer 132 may be formed at an obtuse angle as in a room temperature, 100° C., and 150° C. of FIG. 13. That is, each of the side surfaces of the second oxide semiconductor layer 132 may be formed in a reverse taper structure. In this case, even when the source electrode 140 and the drain electrode 150 are provided to cover the side surfaces of the first oxide semiconductor layer 131 and the side surfaces of the second oxide semiconductor layer 132, a void may be formed in a boundary between the first oxide semiconductor layer 131 and the second oxide semiconductor layer 132. Therefore, an etchant for etching the source electrode 140 and the drain electrode 150 can penetrate into the void, and the first oxide semiconductor layer 131 and the second oxide semiconductor layer 132 can be additionally etched by the etchant penetrating into the void. For this reason, the first oxide semiconductor layer 131 and the second oxide semiconductor layer 132 can be formed to have an undesired channel length or channel width.

However, as in FIG. 12, when the temperature of the first substrate 1110 is equal to or higher than 200° C. in the process of depositing the first oxide semiconductor layer 131 and the second oxide semiconductor layer 132, the etch rate (Å/sec) of the first oxide semiconductor layer 131 is substantially equal to or lower than that of the second oxide semiconductor layer 132. In this case, the slope of each of the side surfaces of the second oxide semiconductor layer 132 may be formed at an acute angle or a right angle as in 200° C. and 250° C. of FIG. 13. That is, each of the side surfaces of the second oxide semiconductor layer 132 may be formed in a taper structure. In this case, even when the source electrode 140 and the drain electrode 150 are provided to cover the side surfaces of the first oxide semiconductor layer 131 and the side surfaces of the second oxide semiconductor layer 132, a void is not formed in the boundary between the first oxide semiconductor layer 131 and the second oxide semiconductor layer 132. Therefore, the first oxide semiconductor layer 131 and the second oxide semiconductor layer 132 are prevented from being additionally etched by an etchant penetrating into the void. Accordingly, the first oxide semiconductor layer 131 and the second oxide semiconductor layer 132 are formed to have a desired channel length or channel width.

Figure 14A:
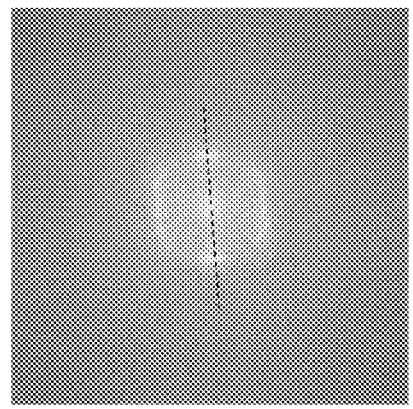
FIGS. 14A to 14C show material properties analysis images of a second oxide semiconductor layer with respect to a variation of a Zn content.
Figure 14B:
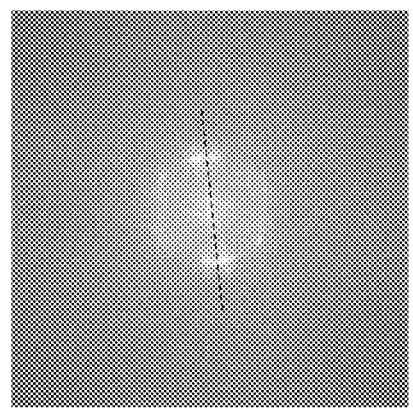
Figure 14C:
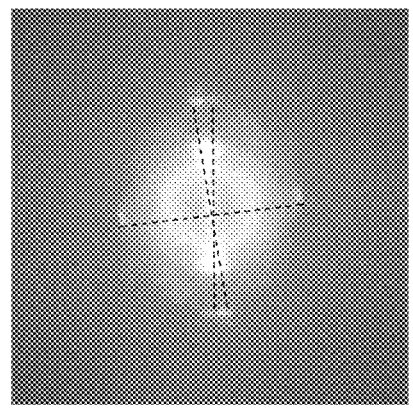

FIGS. 14A to 14C show material properties analysis images of the second oxide semiconductor layer with respect to a variation of a Zn content.

In FIGS. 14A to 14C, an example where the second oxide semiconductor layer 132 is formed of IGZTO is shown. In this case, FIG. 14A shows a material properties analysis image of the second oxide semiconductor layer 132 when a composition ratio of IGZT of the second oxide semiconductor layer 132 is 4:12:12:1. FIG. 14B shows a material properties analysis image of the second oxide semiconductor layer 132 when a composition ratio of IGZT of the second oxide semiconductor layer 132 is 4:12:16:1. FIG. 14C shows a material properties analysis image of the second oxide semiconductor layer 132 when a composition ratio of IGZT of the second oxide semiconductor layer 132 is 4:12:20:1. Each of the material properties analysis images shown in FIGS. 14A to 14C has a transmission electron microscopy fast Fourier transform (TEM FFT) pattern.

As in FIG. 14A, when a composition ratio of IGZT of the second oxide semiconductor layer 132 is 4:12:12:1, only a crystal axis (a dotted line) in one direction is shown at a material properties analysis measurement point of the second oxide semiconductor layer 132. Also, as in FIG. 14B, when a composition ratio of IGZT of the second oxide semiconductor layer 132 is 4:12:16:1, only a crystal axis (a dotted line) in one direction is shown at a material properties analysis measurement point of the second oxide semiconductor layer 132. However, as in FIG. 14C, when a composition ratio of IGZT of the second oxide semiconductor layer 132 is 4:12:20:1, crystal axes (dotted lines) in three directions are shown at a material properties analysis measurement point of the second oxide semiconductor layer 132.

In a case where the crystal axes (the dotted lines) in the three directions are shown in the second oxide semiconductor layer 132 as in FIG. 14C, the case represents that structural phase segregation occurs in a material properties analysis measurement point of the second oxide semiconductor layer 132. That is, the case represents that deformation occurs in stoichiometry in the second oxide semiconductor layer 132, and in this case, the PBTS characteristic and NBTIS characteristic of the TFT 100 can be degraded. Therefore, a content ratio (Zn/In) of Zn to In of the second oxide semiconductor layer 132 may be lower than 5.

Moreover, the first oxide semiconductor layer 131 may be provided so that only a crystal axis in one direction is shown at a material properties analysis measurement point as in the second oxide semiconductor layer 132 shown in FIG. 14A. In this case, a crystal axis shown in the first oxide semiconductor layer 131 may be parallel to a crystal axis shown in the second oxide semiconductor layer 132.

Figure 15:
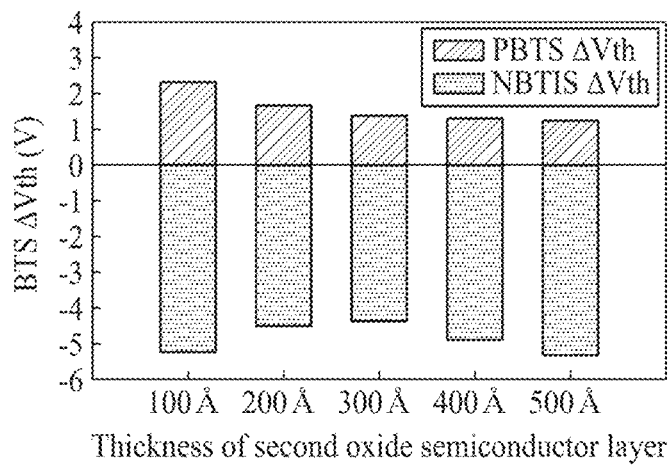
FIG. 15 is a graph showing a PBTS threshold voltage shift value and an NBTIS threshold voltage shift value of a TFT with respect to a thickness variation of a second oxide semiconductor layer when a thickness of a first oxide semiconductor layer is 300 Å.

FIG. 15 is a graph showing a PBTS threshold voltage shift value and an NBTIS threshold voltage shift value of a TFT with respect to a thickness variation of the second oxide semiconductor layer when a thickness of the first oxide semiconductor layer is 300 Å.

FIG. 15 shows a PBTS threshold voltage shift value "PBTSΔVth" and an NBTIS threshold voltage shift value "NBTISΔVth" of the TFT 100 when a thickness of the first oxide semiconductor layer 131 is fixed to 300 Å and a thickness of the second oxide semiconductor layer 132 are changed to 100 Å, 200 Å, 300 Å, 400 Å, and 500 Å. Also, FIG. 15 shows a PBTS threshold voltage shift value "PBTSΔVth" and an NBTIS threshold voltage shift value "NBTISΔVth" of the TFT 100 when the first oxide semiconductor layer 131 is formed of IGZTO, the second oxide semiconductor layer 132 is formed of IGZTO, a composition ratio of IGZT of the first oxide semiconductor layer 131 is 4:1:4:1, and a composition ratio of IGZT of the second oxide semiconductor layer 132 is 4:12:16:1.

The first oxide semiconductor layer 131 may be formed to have a thickness of 100 Å or more, based on thin film deposition uniformity and electron mobility characteristics, and based on a process time, the first oxide semiconductor layer 131 may be formed to have a thickness of 1,000 Å or less. Therefore, a thickness of the first oxide semiconductor layer 131 may be previously set to 100 Å to 1,000 Å, based on a shift of a threshold voltage and an oxygen or hydrogen concentration of an upper or lower insulation layer contacting the first oxide semiconductor layer 131. In FIG. 15, an experiment has been performed under a condition where the thickness of the first oxide semiconductor layer 131 is 300 Å.

Referring to FIG. 15, a BTS threshold voltage shift value "BTSΔVth" may be within a range of −5 V to 2 V, based on a positive shift of a threshold voltage of the TFT 100 provided in the display device. The BTS threshold voltage shift value "BTSΔVth" includes a PBTS threshold voltage shift value "PBTSΔVth" and an NBTIS threshold voltage shift value "NBTISΔVth".

As in FIG. 15, when a thickness of the second oxide semiconductor layer 132 is 100 Å, the BTS threshold voltage shift value "BTSΔVth" of the TFT 100 is outside a range of −5 V to 2 V. Also, when a thickness of the second oxide semiconductor layer 132 is 500 Å, the BTS threshold voltage shift value "BTSΔVth" of the TFT 100 is outside a range of −5 V to 2 V. On the other hand, when a thickness of the second oxide semiconductor layer 132 is 200 Å, 300 Å, or 400 Å, the BTS threshold voltage shift value "BTSΔVth" of the TFT 100 is within a range of −5 V to 2 V.

Therefore, based on the BTS threshold voltage shift value "BTSΔVth" of the TFT 100, when a thickness of the first oxide semiconductor layer 131 is 300 Å, a thickness of the second oxide semiconductor layer 132 may be 200 Å, 300 Å, or 400 Å. That is, the thickness of the second oxide semiconductor layer 132 may be set thicker than one-third (1/3) of the thickness of the first oxide semiconductor layer 131 and thinner than five-third (5/3) of the thickness of the first oxide semiconductor layer 131.

Figure 16:
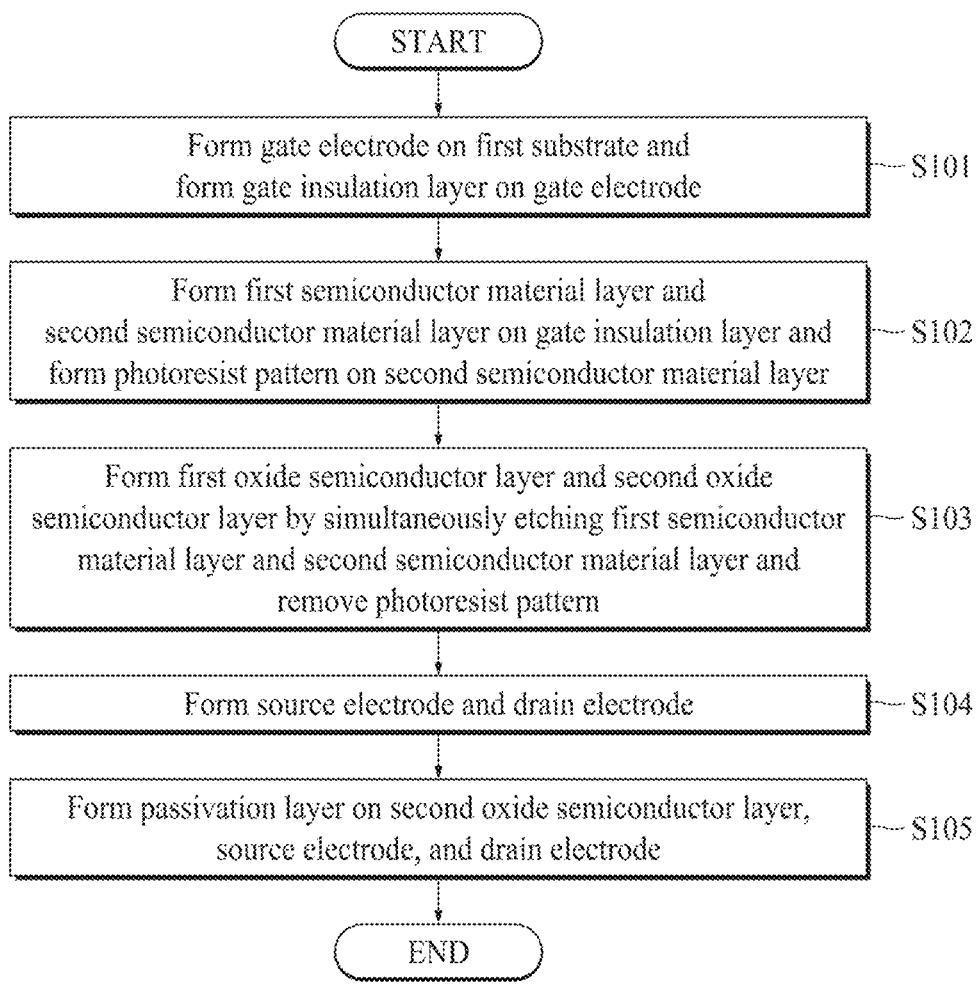
FIG. 16 is a flowchart illustrating a method of manufacturing a TFT according to an embodiment of the present disclosure.

FIG. 16 is a flowchart illustrating a method of manufacturing a TFT according to an embodiment of the present disclosure. FIGS. 17A to 17E are cross-sectional views for describing a method of manufacturing a TFT according to an embodiment of the present disclosure.

Hereinafter, a method of manufacturing a TFT according to an embodiment of the present disclosure will be described in detail with reference to FIGS. 16 and 17A to 17E.

Figure 17A:
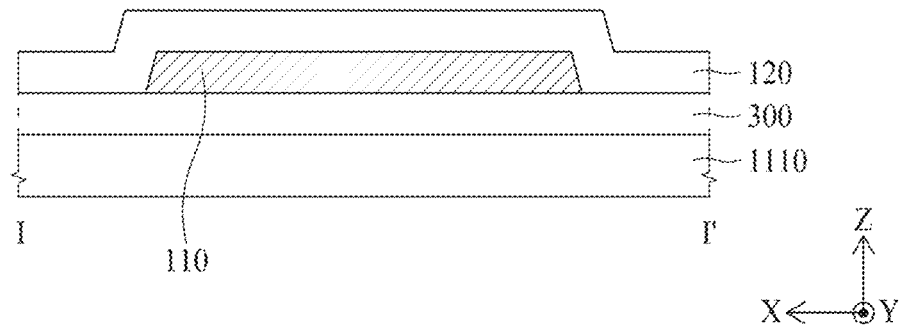
FIGS. 17A to 17E are cross-sectional views for describing a method of manufacturing a TFT according to an embodiment of the present disclosure.

First, as in FIG. 17A, a gate electrode 110 may be formed on a first substrate 1110, and a gate insulation layer 120 may be formed on the gate electrode 110. (S101 of FIG. 16)

In detail, a first metal layer may be formed on the first substrate 1110 through a sputtering process. Subsequently, a photoresist pattern may be formed on the first metal layer, and then, by patterning the first metal layer through a mask process of etching the first metal layer, the gate electrode 110 may be formed. The gate electrode 110 may be formed of a single layer or a multilayer which includes one of Mo, Al, Cr, Au, Ti, Ni, Nd, and Cu, or an alloy thereof.

Alternatively, a buffer layer 300 may be formed on the first substrate 1110, for protecting a TFT 100 from water penetrating through the first substrate 1110, and the gate electrode 110 may be formed on the buffer layer 300. In this case, the buffer layer 300 may include a plurality of inorganic layers which are alternately stacked. For example, the buffer layer 300 may be formed of a multilayer where one or more inorganic layers of SiOx, SiNx, and SiON are alternately stacked. The buffer layer 300 may be formed through a plasma enhanced chemical vapor deposition (PECVD) process.

Subsequently, the gate insulation layer 120 may be formed on the gate electrode 110. The gate insulation layer 120 may be formed of an inorganic layer, and for example, may be formed of SiOx, SiNx, or a multilayer thereof. The gate insulation layer 120 may be formed through a PECVD process.

Figure 17B:
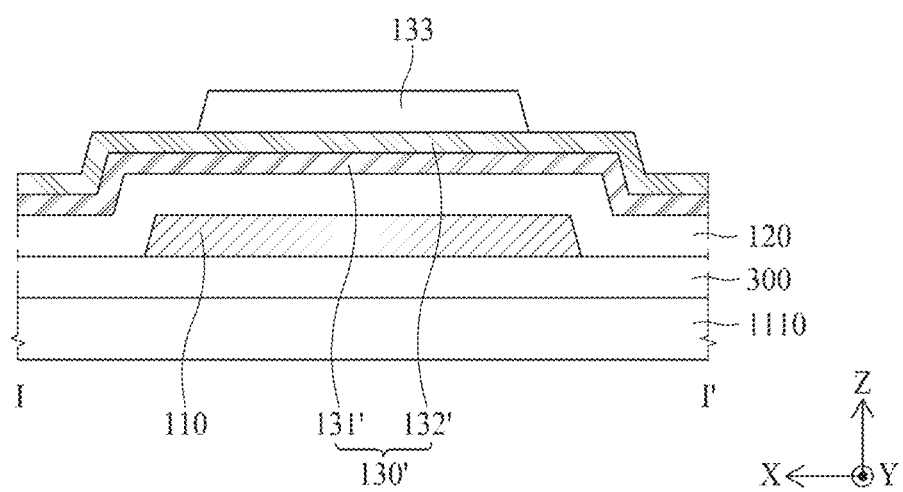

Second, as in FIG. 17B, a first semiconductor material layer 131' and a second semiconductor material layer 132' may be formed on the gate insulation layer 120, and a photoresist pattern 133 may be formed on the second semiconductor layer 132'. (S102 of FIG. 16)

In detail, the first semiconductor material layer 131' may be formed on the gate insulation layer 120. The first semiconductor material layer 131' may be formed of IGZTO, for increasing electron mobility.

Subsequently, the second semiconductor material layer 132' may be formed on the first semiconductor material layer 131'. The second semiconductor material layer 132' may include IGZO, for preventing a threshold voltage from being rapidly shifted due to a variation of a channel length. The second semiconductor material layer 132' may be formed of IGZO or IGZTO. If the second semiconductor material layer 132' is formed of IGZTO, the second semiconductor material layer 132' may have a composition ratio which differs from that of the first semiconductor material layer 131'. The first semiconductor material layer 131' and the second semiconductor material layer 132' may be continuously deposited in the same equipment. Also, the first semiconductor material layer 131' and the second semiconductor material layer 132' may be deposited in a state where a temperature of the first substrate 1110 is maintained as 200° C. or more.

Subsequently, a photoresist pattern 133 may be formed on the second semiconductor material layer 132'.

Figure 17C:
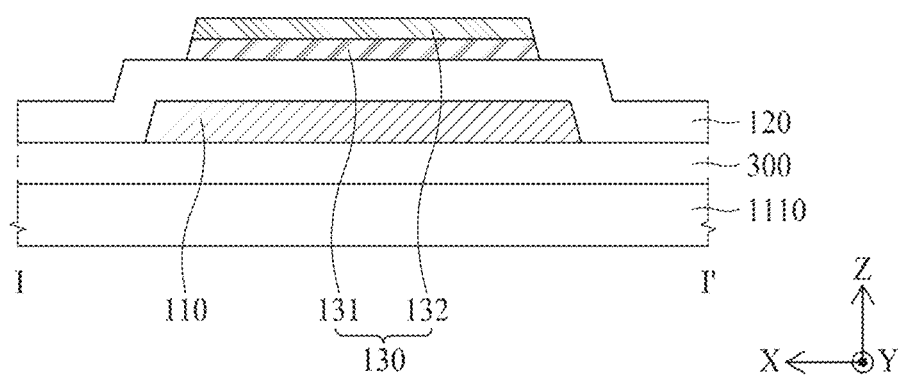

Third, as in FIG. 17C, a first oxide semiconductor layer 131 and a second oxide semiconductor layer 132 may be formed by simultaneously etching the first semiconductor material layer 131' and the second semiconductor material layer 132', and the photoresist pattern 133 may be removed. (S103 of FIG. 16)

In detail, as described above with reference to FIGS. 12 and 13, in a case where the first semiconductor material layer 131' and the second semiconductor material layer 132' are etched under a condition where a temperature of the first substrate 1110 is lower than 200° C. in a process of depositing the first semiconductor material layer 131' and the second semiconductor material layer 132', a slope of a side surface of the second oxide semiconductor layer 132 may be formed at an obtuse angle because an etch rate of the first semiconductor material layer 131' is higher than that of the second semiconductor material layer 132'. In this case, even when a source electrode 140 and a drain electrode 150 are provided to cover a side surface of the first oxide semiconductor layer 131 and the side surface of the second oxide semiconductor layer 132, a void can be formed in a boundary between the first oxide semiconductor layer 131 and the second oxide semiconductor layer 132. Therefore, an etchant for etching the source electrode 140 and the drain electrode 150 can penetrate into the void, and the first oxide semiconductor layer 131 and the second oxide semiconductor layer 132 can be additionally etched by the etchant penetrating into the void. For this reason, the first oxide semiconductor layer 131 and the second oxide semiconductor layer 132 can be formed to have an undesired channel length or channel width.

However, as in FIG. 12, in a case where the first semiconductor material layer 131' and the second semiconductor material layer 132' are etched under a condition where the temperature of the first substrate 1110 is maintained as 200° C. or more in a process of depositing the first semiconductor material layer 131' and the second semiconductor material layer 132', the slope of the side surface of the second oxide semiconductor layer 132 may be formed at an acute angle because an etch rate of the first semiconductor material layer 131' is equal to or lower than that of the second semiconductor material layer 132'. In this case, even when the source electrode 140 and the drain electrode 150 are provided to cover the side surface of the first oxide semiconductor layer 131 and the side surface of the second oxide semiconductor layer 132, a void is not formed in the boundary between the first oxide semiconductor layer 131 and the second oxide semiconductor layer 132. Therefore, the first oxide semiconductor layer 131 and the second oxide semiconductor layer 132 are prevented from being additionally etched by an etchant penetrating into the void. Accordingly, the first oxide semiconductor layer 131 and the second oxide semiconductor layer 132 are formed to have a desired channel length or channel width.

The first oxide semiconductor layer 131 and the second oxide semiconductor layer 132 may be formed by simultaneously etching the first semiconductor material layer 131' and the second semiconductor material layer 132' with an etchant capable of simultaneously etching the first semiconductor material layer 131' and the second semiconductor material layer 132' like an oxalic acid. Subsequently, the photoresist pattern 133 may be removed through a strip process.

Figure 17D:
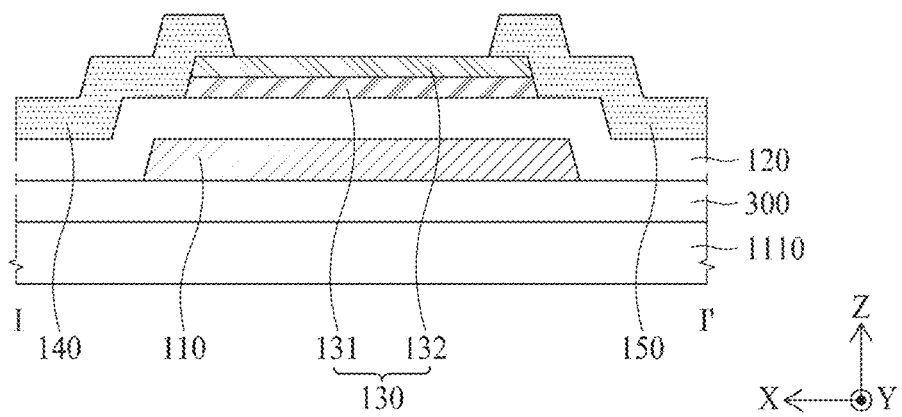

Fourth, as in FIG. 17D, the source electrode 140 and the drain electrode 150 may be formed. (S104 of FIG. 16)

The source electrode 140 may directly contact one side of the second oxide semiconductor layer 132 and one side of the first oxide semiconductor layer 131 which is a main channel layer. In detail, the source electrode 140 may directly contact one side surface of the first oxide semiconductor layer 131 and one side surface and a portion of an upper surface of the second oxide semiconductor layer 132. Also, the drain electrode 150 may directly contact the other side of the first oxide semiconductor layer 131 and the other side of the second oxide semiconductor layer 132. In detail, the drain electrode 150 may directly contact the other side surface of the first oxide semiconductor layer 131 and the other side surface and a portion of the upper surface of the second oxide semiconductor layer 132. The source electrode 140 and the drain electrode 150 may each be formed of a single layer or a multilayer which includes one of Mo, Al, Cr, Au, Ti, Ni, Nd, and Cu, or an alloy thereof.

Figure 17E:
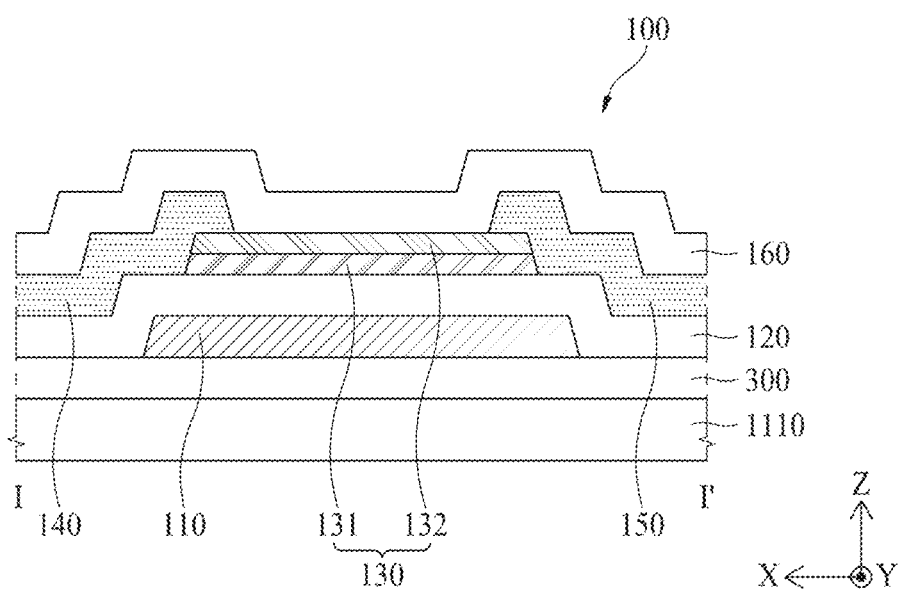

Fifth, as in FIG. 17E, a passivation layer 160 may be provided on the oxide semiconductor layer 130, the source electrode 140, and the drain electrode 150. (S105 of FIG. 16)

The passivation layer 160 may be formed of an inorganic layer, and for example, may be formed of SiOx, SiNx, or a multilayer thereof.

Figure 18:
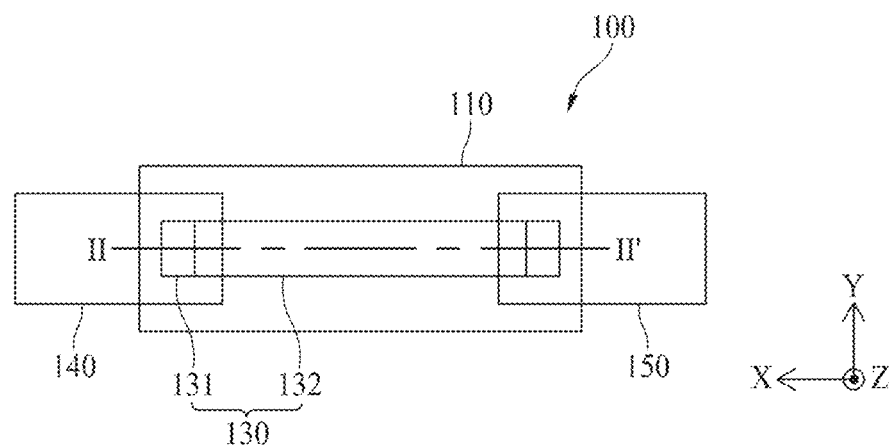
FIG. 18 is a plan view illustrating a TFT according to another embodiment of the present disclosure.
Figure 19:
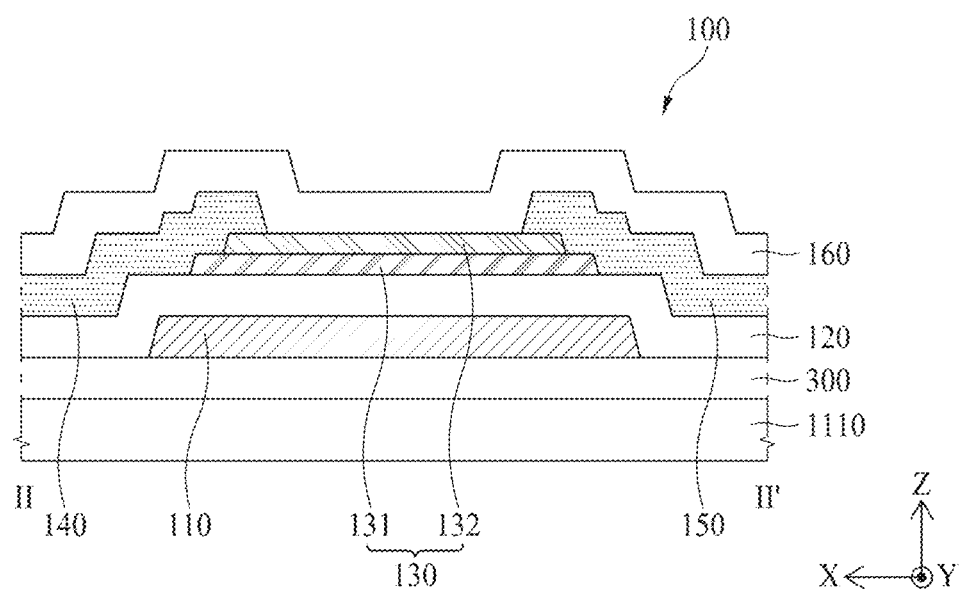
FIG. 19 is a cross-sectional view illustrating an example taken along line II-II' of FIG. 18.

FIG. 18 is a plan view illustrating a TFT according to another embodiment of the present disclosure. FIG. 19 is a cross-sectional view illustrating an example taken along line II-II' of FIG. 18.

Except for that a length of a first oxide semiconductor layer 131 in a first direction (an X-axis direction) is set longer than a length of a second oxide semiconductor layer 132 in the first direction (the X-axis direction), descriptions of FIGS. 18 and 19 are substantially the same as descriptions given above with reference to FIGS. 6 and 7, and thus, overlapping description is omitted.

In FIGS. 18 and 19, the first oxide semiconductor layer 131 may have an area which is wider than that of the second oxide semiconductor layer 132, and thus, a contact area between each of a source electrode 140 and a drain electrode 150 and the first oxide semiconductor layer 131 which is a main channel layer is enlarged. Therefore, in another embodiment of the present disclosure illustrated in FIGS. 18 and 19, a contact resistance is reduced.

Figure 20:
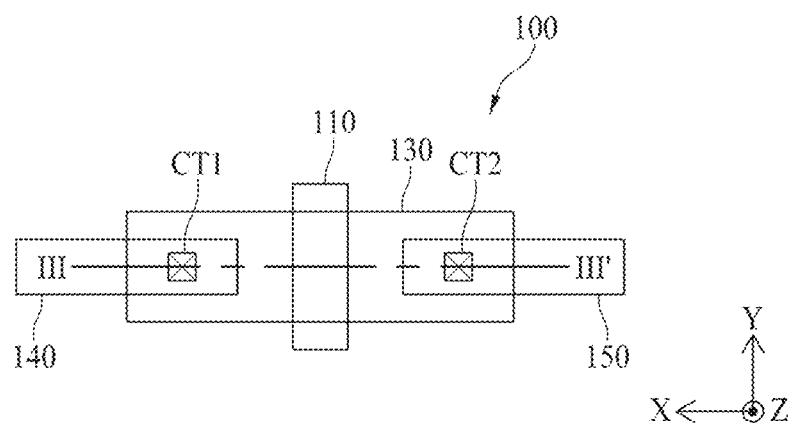
FIG. 20 is a plan view illustrating a TFT according to another embodiment of the present disclosure.
Figure 21:
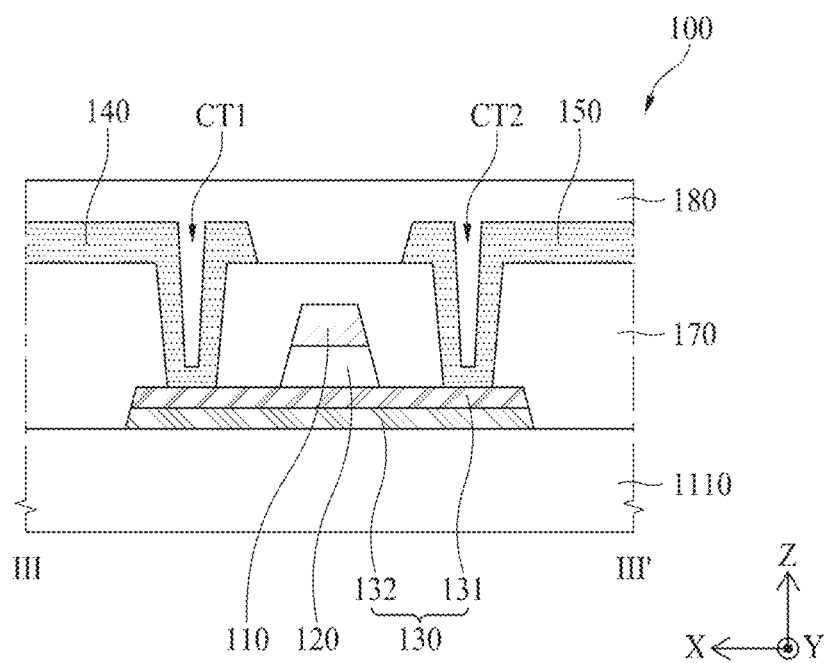
FIG. 21 is a cross-sectional view illustrating an example taken along line III-III' of FIG. 20.

FIG. 20 is a plan view illustrating a TFT 100 according to another embodiment of the present disclosure. FIG. 21 is a cross-sectional view illustrating an example taken along line III-III' of FIG. 20.

In FIGS. 20 and 21, the TFT 100 according to another embodiment of the present disclosure is illustrated as being provided in a coplanar structure. The coplanar structure may have a top gate structure where a gate electrode is provided on an active layer.

Referring to FIGS. 20 and 21, the TFT 100 according to another embodiment of the present disclosure may include a gate electrode 110, an oxide semiconductor layer 130, a source electrode 140, and a drain electrode 150.

The TFT 100 may be provided on a first substrate 1110. The first substrate 1110 may be formed of plastic, glass, and/or the like.

A buffer layer 300 may be provided on the first substrate 1110, for protecting the TFT 100 from water penetrating through the first substrate 1110. The buffer layer 300 may include a plurality of inorganic layers which are alternately stacked. For example, the buffer layer 300 may be formed of a multilayer where one or more inorganic layers of SiOx, SiNx, and SiON are alternately stacked. The buffer layer 300 may be omitted.

An oxide semiconductor layer 130 may be formed on the buffer layer 300. The oxide semiconductor layer 130 may include a first oxide semiconductor layer 131 and a second oxide semiconductor layer 132. The first oxide semiconductor layer 131 may be a main channel layer through which an electron moves, and thus, may be disposed close to the gate electrode 110. Therefore, the first oxide semiconductor layer 131 may be defined as a layer which is disposed closer to the gate electrode 110 than the second oxide semiconductor layer 132, and the second oxide semiconductor layer 132 may be defined as a layer which is disposed farther away from the gate electrode 110 than the first oxide semiconductor layer 131. For example, in a case where the TFT 100 is implemented in the coplanar structure as in FIGS. 20 and 21, since the gate electrode 110 is disposed on the oxide semiconductor layer 130, the second oxide semiconductor layer 132 may be disposed on the first substrate 1110 or the buffer layer 300 of the first substrate 1110, and the first oxide semiconductor layer 131 may be disposed on the second oxide semiconductor layer 132.

A light blocking layer may be formed under the oxide semiconductor layer 130, for blocking light incident on the oxide semiconductor layer 130 from the first substrate 1110.

A gate insulation layer 120 may be provided on the oxide semiconductor layer 130. The gate insulation layer 120 may be formed of an inorganic layer, and for example, may be formed of SiOx, SiNx, or a multilayer thereof.

The gate electrode 110 may be formed on the gate insulation layer 120. The gate electrode 110 may be disposed to overlap the oxide semiconductor layer 130 with the gate insulation layer 120 therebetween. The gate electrode 110 may be formed of a single layer or a multilayer which includes one of Mo, Al, Cr, Au, Ti, Ni, Nd, and Cu, or an alloy thereof.

In FIG. 21, an example where the gate insulation layer 120 is disposed only between the gate electrode 110 and the oxide semiconductor layer 130 is illustrated, but embodiments of the present disclosure are not limited thereto. In other embodiments, the gate insulation layer 120 may be formed to cover the first substrate 1110 and the oxide semiconductor layer 130.

An interlayer insulation layer 170 may be formed on the gate electrode 110 and the oxide semiconductor layer 130. The interlayer insulation layer 170 may be formed of an inorganic layer, and for example, may be formed of SiOx, SiNx, or a multilayer thereof.

A first contact hole CT1 which passes through the interlayer insulation layer 170 and exposes one side of the first oxide semiconductor layer 131 and a second contact hole CT2 which passes through the interlayer insulation layer 170 and exposes the other side of the first oxide semiconductor layer 131 may be formed in the interlayer insulation layer 170.

The source electrode 140 and the drain electrode 150 may be formed on the interlayer insulation layer 170. The source electrode 140 may contact one side of the first oxide semiconductor layer 131 through the first contact hole CT1. The drain electrode 150 may contact the other side of the first oxide semiconductor layer 131 through the second contact hole CT2.

A passivation layer 160 may be formed on the source electrode 140 and the drain electrode 150. The passivation layer 160 may be formed of an inorganic layer, and for example, may be formed of SiOx, SiNx, or a multilayer thereof.

The first oxide semiconductor layer 131 may be formed of IGZTO instead of IGZO, for increasing electron mobility.

Moreover, the second oxide semiconductor layer 132 may be formed of IGZTO. In detail, a composition ratio of IGZT of the second oxide semiconductor layer 132 may differ from that of IGZT of the first oxide semiconductor layer 131, so that a threshold voltage is prevented from being shifted even when the oxide semiconductor layer 130 is implemented as a short channel, the second oxide semiconductor layer 132 caps and protects the first oxide semiconductor layer 131 in order for the first oxide semiconductor layer 131 to stably act as a channel, and an etch rate of the second oxide semiconductor layer 132 increases.

A composition ratio of IGZT of the first oxide semiconductor layer 131 and a composition ratio of IGZT of the second oxide semiconductor layer 132 are substantially the same as descriptions given above with reference to FIGS. 6 to 13, and thus, overlapping description is omitted.

Figure 22:
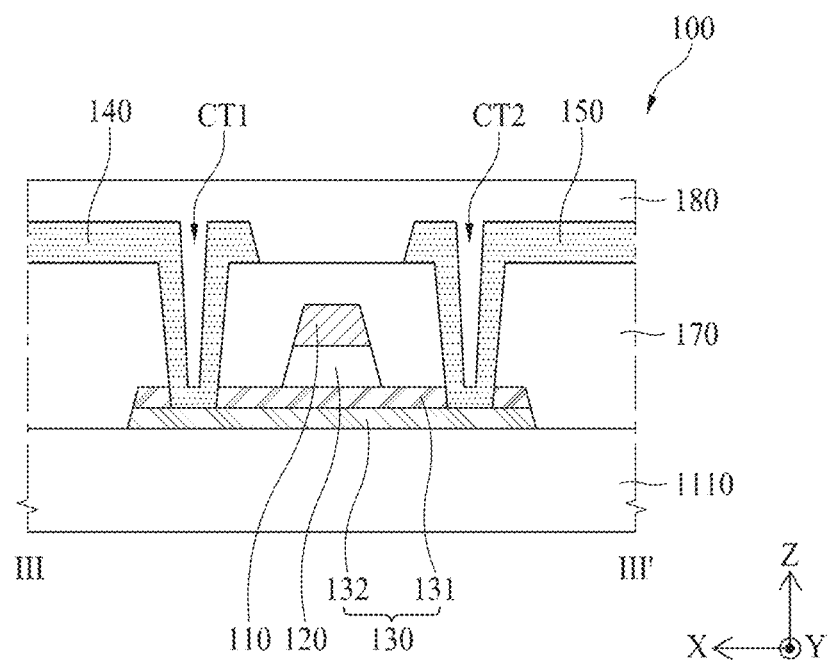
FIG. 22 is a cross-sectional view illustrating another example taken along line III-III' of FIG. 20.

FIG. 22 is a cross-sectional view illustrating another example taken along line III-III' of FIG. 20.

Except for that a source electrode 140 and a drain electrode 150 are connected to a second oxide semiconductor layer 132 as well as a first oxide semiconductor layer 131, a description of FIG. 22 is substantially the same as description given above with reference to FIGS. 20 and 21, and thus, overlapping description is omitted.

Referring to FIG. 22, each of first and second contact holes CT1 and CT2 may pass through a first oxide semiconductor layer 131 and an interlayer insulation layer 170 and may expose a second oxide semiconductor layer 132. Therefore, the source electrode 140 may be connected to the first oxide semiconductor layer 131 and the second oxide semiconductor layer 132 through the first contact hole CT1, and the drain electrode 150 may be connected to the first oxide semiconductor layer 131 and the second oxide semiconductor layer 132 through the second contact hole CT2.

As described above, according to the embodiments of the present disclosure, the first oxide semiconductor layer which corresponds to a main channel layer may be formed of IGZTO, and the second oxide semiconductor layer may be formed of IGZO. As a result, according to the embodiments of the present disclosure, electron mobility increases, and moreover, a threshold voltage is prevented from being shifted based on a channel length. Accordingly, the embodiments of the present disclosure may be applied to flat panel display devices which require high-speed driving due to a high resolution.

Moreover, according to the embodiments of the present disclosure, a slope of a side surface of the first oxide semiconductor layer may be formed to have an acute angle, and a slope of a side surface of the second oxide semiconductor layer may be formed to have a right angle or an acute angle. If the source electrode and the drain electrode cover the side surface of the first oxide semiconductor layer and the side surface of the second oxide semiconductor layer, a void is not formed in a boundary between the first oxide semiconductor layer and the second oxide semiconductor layer. Therefore, according to the embodiments of the present disclosure, the first oxide semiconductor layer and the second oxide semiconductor layer are prevented from being additionally etched by an etchant penetrating into the void. Accordingly, according to the embodiments of the present disclosure, the first oxide semiconductor layer and the second oxide semiconductor layer may be formed to have a desired channel length or channel width.

Moreover, according to the embodiments of the present disclosure, in order to prevent a PBTS characteristic and an NBTIS characteristic of a TFT from being degraded, the second oxide semiconductor layer may be formed so that a content ratio (Zn/In) of Zn to In of the second oxide semiconductor layer is lower than 5.

Furthermore, in the embodiments of the present disclosure, based on a positive shift and a negative shift of a threshold voltage of a TFT, a thickness of the second oxide semiconductor layer may be set thicker than one-third (1/3) of a thickness of the first oxide semiconductor layer and thinner than five-third (5/3) of the thickness of the first oxide semiconductor layer.

As described above, according to the embodiments of the present disclosure, the oxide semiconductor layer may include the first oxide semiconductor layer, which corresponds to a main channel layer and includes IGZTO, and the second oxide semiconductor layer including IGZO. The second oxide semiconductor layer may include IGZO or IGZTO. If the second oxide semiconductor layer includes IGZTO, a composition ratio of IGZTO of the second oxide semiconductor layer may differ from that of IGZTO of the first oxide semiconductor layer. As a result, according to the embodiments of the present disclosure, electron mobility increases, and moreover, a threshold voltage is prevented from being shifted based on a channel length. Accordingly, the embodiments of the present disclosure may be applied to flat panel display devices which require high-speed driving due to a high resolution.

Moreover, according to the embodiments of the present disclosure, a slope of a side surface of the first oxide semiconductor layer may be formed to have an acute angle, and a slope of a side surface of the second oxide semiconductor layer may be formed to have a right angle or an acute angle. If the source electrode and the drain electrode cover the side surface of the first oxide semiconductor layer and the side surface of the second oxide semiconductor layer, a void is not formed in a boundary between the first oxide semiconductor layer and the second oxide semiconductor layer. Therefore, according to the embodiments of the present disclosure, the first oxide semiconductor layer and the second oxide semiconductor layer are prevented from being additionally etched by an etchant penetrating into the void. Accordingly, according to the embodiments of the present disclosure, the first oxide semiconductor layer and the second oxide semiconductor layer may be formed to have a desired channel length or channel width.

Moreover, according to the embodiments of the present disclosure, in order to prevent a PBTS characteristic and an NBTIS characteristic of a TFT from being degraded, the second oxide semiconductor layer may be formed so that a content ratio (Zn/In) of Zn to In of the second oxide semiconductor layer is lower than 5.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/ or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A thin film transistor comprising:
   a first oxide semiconductor layer including indium (In), gallium (Ga), zinc (Zn), tin (Sn) and oxygen (O);
   a second oxide semiconductor layer including indium (In), gallium (Ga), zinc (Zn) and oxygen (O), wherein the second oxide semiconductor layer is disposed on the first oxide semiconductor layer; and
   a gate electrode disposed closer to the first oxide semiconductor layer than the second oxide semiconductor layer,
   wherein
      a content ratio (Ga/In) of Ga to In of the second oxide semiconductor layer is higher than a content ratio (Ga/In) of Ga to In of the first oxide semiconductor layer, and
      a content ratio (Zn/In) of Zn to In of the second oxide semiconductor layer is higher than a content ratio (Zn/In) of Zn to In of the first oxide semiconductor layer,
   wherein
      an inclined angle of one side surface of the first oxide semiconductor layer is an acute angle, and
      an inclined angle of one side surface of the second oxide semiconductor layer is 90 degrees or an acute angle.

2. The thin film transistor of claim 1, wherein a content ratio (Zn/In) of Zn to In of the second oxide semiconductor layer is lower than 5.

3. The thin film transistor of claim 1, wherein a thickness of the second oxide semiconductor layer is thicker than one-third of a thickness of the first oxide semiconductor layer and thinner than five-third of the thickness of the first oxide semiconductor layer.

4. The thin film transistor of claim 1, wherein the gate electrode is disposed under the first oxide semiconductor layer.

5. The thin film transistor of claim 4, further comprising:
   a source electrode contacting one side of the first oxide semiconductor layer and one side of the second oxide semiconductor layer; and
   a drain electrode contacting another side of the first oxide semiconductor layer and another side of the second oxide semiconductor layer.

6. The thin film transistor of claim 5, wherein a length of the first oxide semiconductor layer in a direction in which the source electrode and the drain electrode are separated from each other is longer than a length of the second oxide semiconductor layer in the direction in which the source electrode and the drain electrode are separated from each other.

7. A thin film transistor comprising:
   a first oxide semiconductor layer including indium (In), gallium (Ga), zinc (Zn), tin (Sn) and oxygen (O); and
   a second oxide semiconductor layer including indium (In), gallium (Ga), zinc (Zn) and oxygen (O),
   wherein
      a content ratio (Ga/In) of Ga to In of the second oxide semiconductor layer is higher than a content ratio (Ga/In) of Ga to In of the first oxide semiconductor layer, and
      a content ratio (Zn/In) of Zn to In of the second oxide semiconductor layer is higher than a content ratio (Zn/In) of Zn to In of the first oxide semiconductor layer
   wherein the second oxide semiconductor layer further includes tin (Sn),
   wherein a content ratio (In/Sn) of In to Sn of the second oxide semiconductor layer is equal to or higher than a content ratio (In/Sn) of In to Sn of the first oxide semiconductor layer.

8. The thin film transistor of claim 7, wherein a content of In of the second oxide semiconductor layer is lower than a content of In of the first oxide semiconductor layer, and a content of Sn of the second oxide semiconductor layer is lower than a content of Sn of the first oxide semiconductor layer.

9. The thin film transistor of claim 7, wherein in the second oxide semiconductor layer, a content ratio of Ga to In satisfies $2 \leq Ga/In \leq 4$, and a content ratio of Zn to In satisfies $2 \leq Zn/In \leq 8$.

10. The thin film transistor of claim 9, wherein in the second oxide semiconductor layer, a content ratio of Sn to In satisfies $0.1 \leq Sn/In \leq 0.5$.

11. A thin film transistor comprising:
    a first oxide semiconductor layer including indium (In), gallium (Ga), zinc (Zn), tin (Sn) and oxygen (O); and
    a second oxide semiconductor layer including indium (In), gallium (Ga), zinc (Zn) and oxygen (O),
    wherein
       a content ratio (Ga/In) of Ga to In of the second oxide semiconductor layer is higher than a content ratio (Ga/In) of Ga to In of the first oxide semiconductor layer, and
       a content ratio (Zn/In) of Zn to In of the second oxide semiconductor layer is higher than a content ratio (Zn/In) of Zn to In of the first oxide semiconductor layer
    wherein a content of Ga of the second oxide semiconductor layer is higher than a content of Ga of the first oxide semiconductor layer, and a content of Zn of the second oxide semiconductor layer is higher than a content of Zn of the first oxide semiconductor layer.

12. A thin film transistor comprising:
    a first oxide semiconductor layer including indium (In), gallium (Ga), zinc (Zn), tin (Sn) and oxygen (O); and
    a second oxide semiconductor layer including indium (In), gallium (Ga), zinc (Zn) and oxygen (O),
    wherein
       a content ratio (Ga/In) of Ga to In of the second oxide semiconductor layer is higher than a content ratio (Ga/In) of Ga to In of the first oxide semiconductor layer, and
       a content ratio (Zn/In) of Zn to In of the second oxide semiconductor layer is higher than a content ratio (Zn/In) of Zn to In of the first oxide semiconductor layer wherein in the first oxide semiconductor layer, a content ratio of In to Sn satisfies $2.5 \leq In/Sn \leq 5$, a content ratio of Ga to Sn satisfies $1 \leq Ga/Sn \leq 2$, and a content ratio of Zn to Sn satisfies $2.5 \leq Zn/Sn \leq 5$.

13. A gate driver comprising a plurality of stages outputting gate signals, the plurality of stages each including a thin film transistor,
wherein the thin film transistor comprising:
a first oxide semiconductor layer including indium (In), gallium (Ga), zinc (Zn), tin (Sn) and oxygen (O); and
a second oxide semiconductor layer including indium (In), gallium (Ga), zinc (Zn) and oxygen (O),
wherein
a content ratio (Ga/In) of Ga to In of the second oxide semiconductor layer is higher than a content ratio (Ga/In) of Ga to In of the first oxide semiconductor layer, and
a content ratio (Zn/In) of Zn to In of the second oxide semiconductor layer is higher than a content ratio (Zn/In) of Zn to In of the first oxide semiconductor layer.

14. A display device comprising a display panel including a plurality of data lines, a plurality of gate lines, and a plurality of pixels respectively provided in a plurality of areas defined by intersections of the plurality of data lines and the plurality of gate lines, the plurality of pixels each including a thin film transistor,
wherein the thin film transistor comprising:
a first oxide semiconductor layer including indium (In), gallium (Ga), zinc (Zn), tin (Sn) and oxygen (O); and
a second oxide semiconductor layer including indium (In), gallium (Ga), zinc (Zn) and oxygen (O),
wherein
a content ratio (Ga/In) of Ga to In of the second oxide semiconductor layer is higher than a content ratio (Ga/In) of Ga to In of the first oxide semiconductor layer, and
a content ratio (Zn/In) of Zn to In of the second oxide semiconductor layer is higher than a content ratio (Zn/In) of Zn to In of the first oxide semiconductor layer.

15. The display device of claim 14, wherein
the display panel further comprises a gate driver outputting gate signals to the plurality of gate lines, and
the gate driver comprises the thin film transistor.

16. A semiconductor device comprising:
a substrate; and
a thin film transistor supported on the substrate, the thin film transistor including an oxide semiconductor layer, a gate electrode and a gate insulating layer formed between the gate electrode and the semiconductor layer;
wherein the oxide semiconductor layer has a layered structure including: a first oxide semiconductor layer including at least In, Ga, Zn, and Sn therein and a second oxide semiconductor layer arranged on the first oxide semiconductor layer, the second oxide semiconductor layer including In, Ga, and Zn therein,
wherein the first oxide semiconductor layer has a first angle θ1 that is an acute angle between a side surface and a lower surface of the first oxide semiconductor layer, and the second oxide semiconductor layer has a second angle θ2 between a side surface and a lower surface of the second oxide semiconductor layer that is larger than or equal to the first angle θ1, and
wherein in the first oxide semiconductor layer, a content ratio of In to Sn satisfies 2.5≤In/Sn≤5, a content ratio of Ga to Sn satisfies 1≤Ga/Sn≤2, and a content ratio of Zn to Sn satisfies 2.5≤Zn/Sn≤5.

17. The semiconductor device structure of claim 16 wherein the second angle θ2 is an acute angle.

18. A thin film transistor comprising:
a first oxide semiconductor layer including indium (In), gallium (Ga), zinc (Zn), tin (Sn) and oxygen (O); and
a second oxide semiconductor layer including indium (In), gallium (Ga), zinc (Zn) and oxygen (O),
wherein
a content ratio Ga/In of the second oxide semiconductor layer is higher than a content ratio Ga/In of the first oxide semiconductor layer, and
wherein in the first oxide semiconductor layer, a content ratio of In to Sn satisfies 2.5≤In/Sn≤5, a content ratio of Ga to Sn satisfies 1≤Ga/Sn≤2, and a content ratio of Zn to Sn satisfies 2.5≤Zn/Sn≤5.

19. The thin film transistor of claim 18 wherein the content ratio of Ga/In of the first oxide semiconductor layer is less than 1 and the content ratio of Ga/In of the second oxide semiconductor layer is 1 or greater.

20. A thin film transistor comprising:
a first oxide semiconductor layer including indium (In), gallium (Ga), zinc (Zn), tin (Sn) and oxygen (O); and
a second oxide semiconductor layer including indium (In), gallium (Ga), zinc (Zn) and oxygen (O),
wherein
a content ratio Ga/Zn of the second oxide semiconductor layer is higher than a content ratio Ga/Zn of the first oxide semiconductor layer, and
wherein in the first oxide semiconductor layer, a content ratio of In to Sn satisfies 2.5≤In/Sn≤5, a content ratio of Ga to Sn satisfies 1≤Ga/Sn≤2, and a content ratio of Zn to Sn satisfies 2.5≤Zn/Sn≤5.

21. The thin film transistor of claim 20 wherein the content ratio of Ga/Zn of the first oxide semiconductor layer is less than 1 and the content ratio of Ga/Zn of the second oxide semiconductor layer is 1 or greater.

* * * * *

UNITED STATES PATENT AND TRADEMARK OFFICE
CERTIFICATE OF CORRECTION

PATENT NO. : 10,930,790 B2
APPLICATION NO. : 15/994765
DATED : February 23, 2021
INVENTOR(S) : SeungJin Kim et al.

It is certified that error appears in the above-identified patent and that said Letters Patent is hereby corrected as shown below:

On the Title Page

On Page 2, Column 2, Item (56) References Cited/Foreign Patent Documents:
"KR 10-2018-0058406" should read: --KR 10-2008-0058406--.

Signed and Sealed this
Twenty-first Day of September, 2021

Drew Hirshfeld
*Performing the Functions and Duties of the*
*Under Secretary of Commerce for Intellectual Property and*
*Director of the United States Patent and Trademark Office*